United States Patent
Thees et al.

(10) Patent No.: US 9,673,210 B1
(45) Date of Patent: Jun. 6, 2017

(54) SEMICONDUCTOR STRUCTURE INCLUDING A NONVOLATILE MEMORY CELL HAVING A CHARGE TRAPPING LAYER AND METHOD FOR THE FORMATION THEREOF

(71) Applicant: GLOBALFOUNDRIES Inc., Grand Cayman (KY)

(72) Inventors: Hans-Juergen Thees, Dresden (DE); Peter Baars, Dresden (DE); Joerg Schmid, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/053,365

(22) Filed: Feb. 25, 2016

(51) Int. Cl.
| H01L 27/1157 | (2017.01) |
| H01L 27/11573 | (2017.01) |
| H01L 29/792 | (2006.01) |
| H01L 29/66 | (2006.01) |
| H01L 29/423 | (2006.01) |
| H01L 21/28 | (2006.01) |

(52) U.S. Cl.
CPC .... H01L 27/1157 (2013.01); H01L 21/28282 (2013.01); H01L 27/11573 (2013.01); H01L 29/42344 (2013.01); H01L 29/66833 (2013.01); H01L 29/792 (2013.01)

(58) Field of Classification Search
CPC ........... H01L 27/1157; H01L 27/11573; H01L 21/28282; H01L 29/42344; H01L 29/66833
See application file for complete search history.

(56) References Cited

U.S. PATENT DOCUMENTS

| 6,747,310 | B2 | 6/2004 | Fan et al. | |
| 7,868,375 | B2 | 1/2011 | Liu et al. | |
| 9,368,605 | B2* | 6/2016 | Lusetsky | H01L 29/66825 |
| 2010/0224927 | A1* | 9/2010 | Ishihara | H01L 27/11521 |
| | | | | 257/324 |
| 2014/0253905 | A1* | 9/2014 | Kim | G01C 15/06 |
| | | | | 356/5.01 |
| 2014/0284682 | A1* | 9/2014 | Takekida | H01L 29/788 |
| | | | | 257/316 |
| 2015/0287738 | A1* | 10/2015 | Kuo | G11C 5/06 |
| | | | | 257/326 |

* cited by examiner

Primary Examiner — Christine Enad
(74) Attorney, Agent, or Firm — Amerson Law Firm, PLLC

(57) ABSTRACT

A semiconductor structure including a nonvolatile memory cell element including an active region formed in a semiconductor material, a select gate structure, a dummy control gate structure and a transfer gate structure is provided. Additionally, an electrically insulating structure extending around each of the select gate structure, the dummy control gate structure and the transfer gate structure is provided. The dummy control gate structure is removed, wherein a first recess is formed in the semiconductor structure. After removing the dummy gate structure, a charge trapping layer and a layer of a control gate electrode material are deposited over the semiconductor structure. Portions of the charge trapping layer and the layer of the control gate electrode material over the electrically insulating structure are removed. Portions of the charge trapping layer and the layer of control gate electrode material in the recess provide a control gate structure of the nonvolatile memory cell.

24 Claims, 17 Drawing Sheets

SEMICONDUCTOR STRUCTURE INCLUDING A NONVOLATILE MEMORY CELL HAVING A CHARGE TRAPPING LAYER AND METHOD FOR THE FORMATION THEREOF

BACKGROUND

1. Field of the Disclosure

Generally, the present disclosure relates to the field of integrated circuits and, more particularly, to integrated circuits including nonvolatile memory devices.

2. Description of the Related Art

Nonvolatile memory, such as, for example, flash memory, may be used in various storage devices, such as, for example, secure digital memory cards (SD cards), USB sticks, solid-state drives (SSDs), and internal memory of various electronic devices, such as, for example, mobile phones, tablet computers, media players, etc. Further applications of nonvolatile memory include embedded systems, wherein nonvolatile memory blocks including nonvolatile memory are provided in addition to logic devices, and wherein the nonvolatile memory devices and the logic devices are physically and electrically integrated on a single substrate. Devices that may be provided on the substrate in addition to the nonvolatile memory cells may include field effect transistors and other circuit elements, such as capacitors, inductivities, diodes and/or resistors. Embedded systems including nonvolatile memory find applications in various fields, such as, for example, in automotive, industry and communication market segments. Integrating nonvolatile memory and logic circuitry on a single substrate can help to improve performance and reduce costs compared to solutions wherein nonvolatile memory and logic circuitry are provided on separate substrates, for example, due to an elimination of input/output buffers, design flexibility, lower power consumption and/or system-on-a-chip capability.

Examples of known nonvolatile memory cells include those described in U.S. Pat. Nos. 6,747,310 and 7,868,375. Nonvolatile memory cells as described in U.S. Pat. Nos. 6,747,310 and 7,868,375 include a source region and a drain region that are formed in a bulk semiconductor substrate. Between the source region and the drain region, a channel region is provided that is doped differently than the source region and the drain region. Over the channel region, a floating gate and a select gate are provided. Over the floating gate, a control gate is provided, and an erase gate is provided over the source region. The select gate, the floating gate, the control gate structure and the erase gate are electrically insulated from each other and from the source, drain and channel regions by electrically insulating materials. The floating gate may be surrounded by electrically insulating material so that it is electrically floating. The source region, the drain region, the select gate, the control gate and the erase gate may have respective electrical contacts connected thereto so that voltages can be applied to the source region, the drain region and the select, control and erase gates for performing operations of programming, erasing and reading the nonvolatile memory cell.

Issues associated with nonvolatile memory cells as described above include a relatively complex processing of the semiconductor structure for the formation of the nonvolatile memory cells, wherein a relatively large number of additional process steps and masks formed by means of photolithography are required, in addition to those employed for the formation of logic transistors. When nonvolatile memory cells are provided on a same semiconductor structure as logic transistors formed in accordance with a relatively advanced technology, for example, in accordance with the 28-nm technology node or below, the additional process steps and the additional photolithography steps performed for the formation of the additional masks may adversely affect the device behavior of the logic transistors. Furthermore, it may be difficult to form silicon germanium in P-channel logic transistors for improving the mobility of holes in the channel thereof when the logic transistors are formed on the same substrate as nonvolatile memory devices because processing steps performed for the formation of the silicon germanium can adversely affect the nonvolatile memory cells.

Other types of nonvolatile memory cells that can be formed on a same substrate as logic transistors include nonvolatile memory cells that have a charge trapping layer instead of a floating gate electrode for storing an electrical charge that is representative of a bit of data written to the nonvolatile memory cell. In some examples of nonvolatile memory cells having a charge trapping layer, a split gate structure may be provided. Charge trapping nonvolatile memory cells having a split gate structure may be formed in a front-end-of-line module of a semiconductor manufacturing process, wherein, however, issues similar to those described above in the context of nonvolatile memory cells including a floating gate may occur.

The present disclosure provides semiconductor structures including nonvolatile memory cells and methods for the formation thereof that may help to substantially overcome or at least reduce some or all of the above-mentioned issues.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure including a nonvolatile memory cell element. In one illustrative embodiment, the nonvolatile memory cell element may include an active region formed in a semiconductor material, a select gate structure, a dummy control gate structure and a transfer gate structure. Additionally, an electrically insulating structure extending around each of the select gate structure, the dummy control gate structure and the transfer gate structure may be provided. The dummy control gate structure is removed, wherein a first recess is formed in the semiconductor structure. After removing the dummy control gate structure, a charge trapping layer and a layer of a control gate electrode material may be deposited over the semiconductor structure. Portions of the charge trapping layer and the layer of the control gate electrode material over the electrically insulating structure may be removed. Portions of the charge trapping layer and the layer of control gate electrode material in the first recess provide a control gate structure of the nonvolatile memory cell.

An illustrative semiconductor structure disclosed herein includes a nonvolatile memory cell. In one illustrative embodiment, the nonvolatile memory cell may include an active region, a select gate structure, a control gate structure and a transfer gate structure. The active region may also include a first source/drain region, a second source/drain region, a third source/drain region and a fourth source/drain region. The select gate structure may be arranged between the first source/drain region and the second source/drain region. The control gate structure may be arranged between the second source/drain region and the third source/drain region. The control gate structure may include a charge trapping layer and a control gate electrode over the charge trapping layer. The transfer gate structure may be arranged between the third source/drain region and the fourth source/drain region. The first source/drain region and the fourth source/drain region may also include a silicide, while the second source/drain region and the third source/drain region, may not contain a silicide.

BRIEF DESCRIPTION OF THE DRAWINGS

The disclosure may be understood by reference to the following description taken in conjunction with the accompanying drawings, in which like reference numerals identify like elements, and in which.

Figure 1:
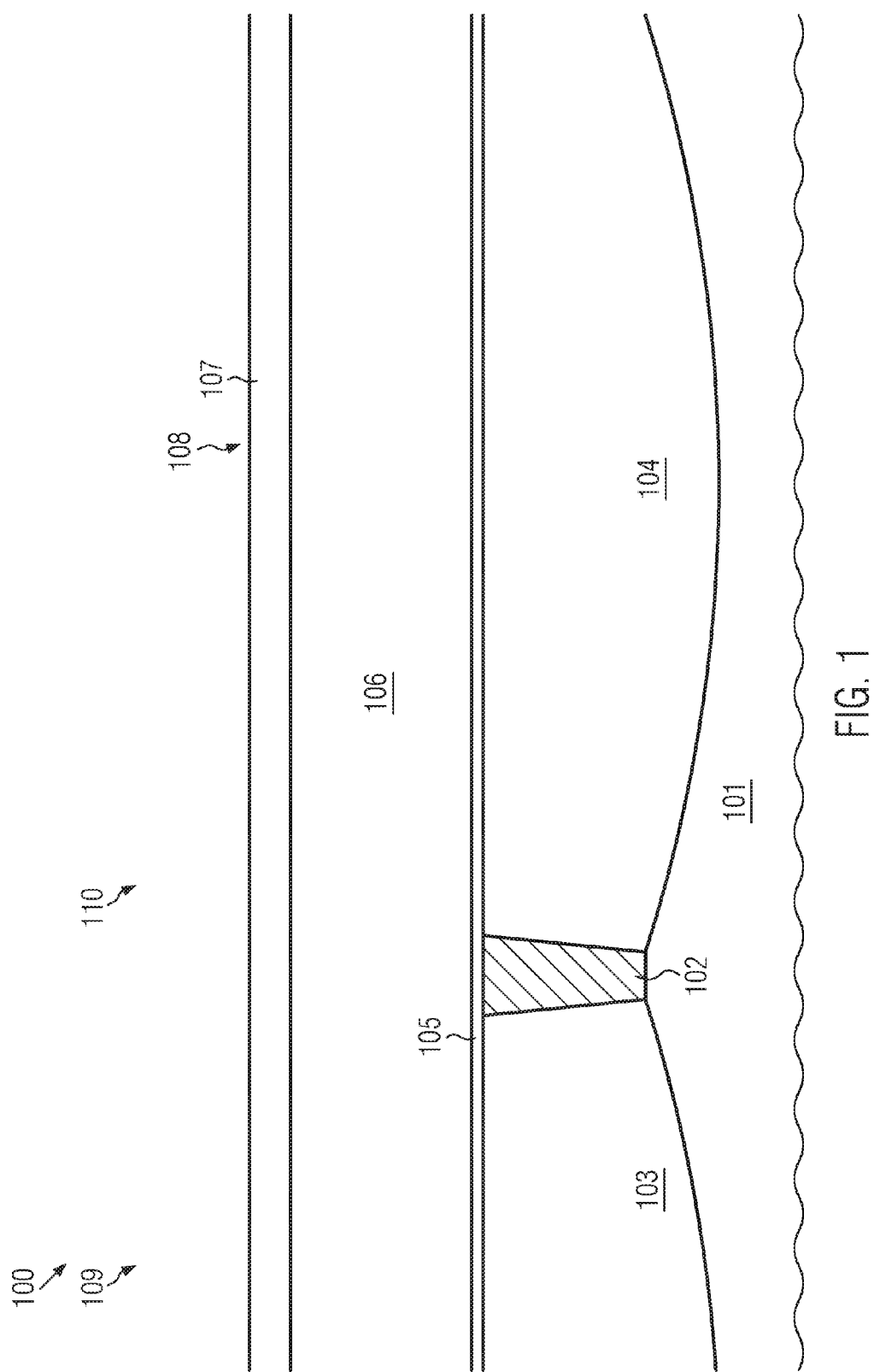
FIGS. 1-8 show schematic cross-sectional views of a semiconductor structure according to an embodiment in stages of a method according to one illustrative embodiment disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Various illustrative embodiments disclosed herein provide a process flow for forming a nonvolatile memory cell including a charge trapping layer that may be fully compatible to bulk semiconductor and fully depleted semiconductor-on-insulator (SOI) technology. Various of the techniques disclosed herein may allow for the formation of nonvolatile memory cells, wherein each nonvolatile memory cell may include a select gate structure, a control gate structure and a transfer gate structure. In one illustrative embodiment, each of the select gate structure, the control gate structure and the transfer gate structure may include a gate insulation layer and a gate electrode, wherein the gate insulation layer of the control gate structure may be provided in the form of a charge trapping layer. In one illustrative embodiment, the charge trapping layer may include an oxide-nitride-oxide layer similar to that used in silicon-oxide-nitride-oxide-silicon (SONOS) memories, an aluminum-nitride-oxide-layer, similar to that used in titanium-aluminum-nitride-oxide-silicon (TANOS) memories, a silicon-rich silicon dioxide layer and/or a nanocrystalline silicon layer. The gate electrode of the control gate structure may also include polysilicon, tungsten and/or aluminum. The charge trapping layer and the gate electrode of the control gate structure may be formed by means of a replacement gate process. In some embodiments, replacement gate processes may also be employed for the formation of the select gate structure and the transfer gate structure. In some embodiments, for example, in embodiments wherein logic transistors are formed in accordance with the 20-nm technology node or the 14-nm technology node on the same substrate as the nonvolatile memory cell, a full replacement gate approach may be used for forming the select gate structure and the transfer gate structure, in accordance with high-k metal gate technology. In other embodiments, in particular in embodiments wherein logic transistors are formed in the same semiconductor structure in accordance with the 28-nm technology node, a hybrid replacement gate process may be used for forming high-k metal gate select gate structures and transfer gate structures. In the hybrid replacement gate process, the gate insulation layers of the select gate structure and the transfer gate structure are not replaced, but gate electrodes of the select gate structure and the transfer gate structure that are provided over the gate insulation layers are exchanged.

In other embodiments, only the control gate structure may be formed in accordance with a replacement gate process, and a so-called gate first manufacturing technique may be used for forming the select gate structure and the transfer gate structure. In such embodiments, each of the select gate structure, the transfer gate structure and a dummy control gate structure that is replaced with the final control gate structure later in the process flow may be formed on the basis of a high-k metal gate stack. Alternatively, a silicon oxynitride-polysilicon gate stack may be used. Gate-first approaches may provide a lower process complexity and well-established technology may be employed.

Gate structures of logic transistors provided in the same semiconductor structure as the nonvolatile memory cells may have a configuration corresponding to that of the select gate structures and the transfer gate structures of the nonvolatile memory cells, and the gate structures of the logic transistors may be formed by means of the same process steps as the select gate structures and the transfer gate structures.

In some embodiments, in particular in embodiments wherein the select gate structures and transfer gate structures of the nonvolatile memory cells are formed in accordance with hybrid replacement gate techniques or gate-first techniques, a sub-nominal pitch may be provided between the select gate structures and the control gate structures, and between the control gate structures and the transfer gate structures. The sub-nominal pitch may be smaller than a pitch that is provided between gate structures of adjacent logic transistors in a logic transistor area of the semiconductor structure, and may provide a spacing between the select, control and transfer gate structures that is smaller than a spacing between gate structures of adjacent logic transistors. Due to the sub-nominal pitch between the gate structures of the nonvolatile memory cells, a bridging of a nitride layer, which may be used for forming a silicide block layer, may be obtained. The silicide block layer formed from the nitride layer can protect the gate electrodes or dummy gate electrodes, respectively, of the select, control and/or transfer gate structures, and its formation may be associated with a relatively large process window. Due to the bridging of the nitride layer, the active regions between the select gate structure and the control gate structure and between the control gate structure and the transfer gate structure can remain covered by nitride after an etch process wherein the nitride layer is etched to form the silicide block layer (the nitride layer is typically too thick to form spacers or get removed), and will not be silicided as described below. After the formation of the silicide block layer, a nickel silicide may be formed in source/drain regions of the nonvolatile memory cells on sides of the select gate structures and transfer gate structures opposite the control gate structures and in source and drain regions of the logic transistors, whereas no nickel silicide is formed in a nonvolatile memory cell transistor that includes the control gate structure, a channel region below the control gate structure and source/drain regions adjacent to the control gate structure. Thus, leakage currents can be reduced. In some embodiments, junctions of the nonvolatile memory cell transistor may be formed by separate ion implantation processes. Thus, they can be tuned for an optimum low leakage/channel hot electron generation that is used for programming. By using separate select gate and transfer gate transistors, which can substantially shut off any voltage from neighboring cells that are not programmed or read, source and drain side disturb mechanisms may be substantially avoided or at least reduced. In the formation of the control gate structures, a dummy control gate structure, which may include a dummy gate insulation layer including silicon dioxide, silicon oxynitride and/or a high-k dielectric material and a dummy gate electrode including polysilicon and/or a metal, may be removed, for example, by means of a standard replacement gate methodology after a deposition of a first interlayer dielectric and chemical mechanical polishing, wherein known wet clean and/or gate etch recipes may be used. After etching and cleaning, the charge trapping layer may be deposited. Thereafter, a gate material of the control gate structure may be deposited, which may be tungsten. Alternatively, polysilicon and/or aluminum may be used. Thereafter, a chemical mechanical polishing process may be performed for finally forming the replacement control gate structure. A standard contact module can finish the processing.

In embodiments wherein a full replacement gate process is used for forming the select gate structures and transfer gate structures of the nonvolatile memory cells, and for forming the gate structures of the logic resistors, a silicide-last process may be used for forming nickel silicide or titanium silicide in source/drain regions of the nonvolatile memory cells on sides of the select gate structures and transfer gate structures opposite the control gate structures and in source and drain regions of logic transistors. Thus, a formation of a nitride layer and a patterning thereof for forming a silicide block layer may be avoided, and the gate structures of the nonvolatile memory cells may be provided approximately at the nominal pitch.

In some embodiments, in particular in embodiments wherein gate first techniques are used for forming the select gate structures and transfer gate structures of the nonvolatile memory cells and the gate structures of the logic transistors, silicon germanium may be provided in P-channel logic transistors for improving a mobility of holes in the channel region. In embodiments wherein full replacement gate processes or hybrid replacement processes are used, a formation of silicon germanium may be omitted.

Compared to techniques for forming nonvolatile memory cells in accordance with the prior art described in the background section of this application, the various techniques as disclosed herein may allow for a less complex process flow for forming both logic transistors and nonvolatile memory cells in a semiconductor structure. Key logic process steps may be the same as in the formation of semiconductor structures including logic transistors only, which may help to ensure that logic transistors will not be impacted by the formation of the nonvolatile memory cells, and process recipes developed for the formation of logic transistors in semiconductor structures including only logic transistors may be reused. By using a charge trapping layer instead of floating gates, an adverse influence of defects may be reduced. By using a charge trapping layer instead of floating gates, defects and imperfections which may be present do not lead to a full loss of charge and therefore memory information. Various illustrative embodiments disclosed herein may provide a compatibility of a formation of nonvolatile memory cells with a formation of logic transistors including silicon germanium by using a middle-of-line replacement gate process for the fabrication of the nonvolatile memory cells. Various illustrative embodiments disclosed herein may be performed in accordance with high-k metal gate process flows, as well as silicon oxynitride-polysilicon process flows for the formation of gate structures of logic transistors and select gate structures and transfer gate structures of nonvolatile memory cells since a dummy control gate structure of the nonvolatile memory cell transistors may be completely removed before the deposition of the charge trapping layer and the layer of control gate electrode material over the semiconductor structure.

FIG. 1 shows a schematic cross-sectional view of a semiconductor structure 100 according to one illustrative embodiment disclosed herein in a stage of a method of manufacturing a semiconductor structure according to an embodiment, wherein a replacement gate approach is used for the formation of logic transistors and nonvolatile memory cells. The semiconductor structure 100 includes a substrate 101, which may be a bulk semiconductor wafer formed of a semiconductor material, such as, for example, silicon. In a trench formed in the semiconductor material of the substrate 101, a trench isolation structure 102 may be provided. The trench isolation structure 102 may include an electrically insulating material, such as, for example, silicon dioxide, and it may provide an electrical insulation between a logic transistor region 109 (on the left side of the trench isolation structure 102 in the view of FIG. 1) and a nonvolatile memory region 110 (on the right side of the trench isolation structure 102 in the view of FIG. 1). As will be detailed in the following, a logic transistor (denoted by reference numeral 508 in FIGS. 5-8) will be formed in the logic transistor region 109, and a nonvolatile memory cell (denoted by reference numeral 707 in FIGS. 7-8) will be formed in the nonvolatile memory cell region 110. Herein, intermediate configurations of the nonvolatile memory cell 707 in stages of the manufacturing process will sometimes be denoted as "nonvolatile memory cell element."

The logic transistor region 109 may include a logic transistor well 103, and the nonvolatile memory cell region 110 may include a nonvolatile memory cell well 104. The logic transistor well 103 may be doped differently than a base doping of the substrate 101. In the logic transistor well 103, an active region of the logic transistor 508 formed at the logic transistor region 109 may be provided. The nonvolatile memory cell well 104 may be doped differently than a base doping of the substrate 101. In the nonvolatile memory cell well 104, an active region of the nonvolatile memory cell 704 formed in the nonvolatile memory cell region 110 may be provided.

The semiconductor structure 100 may further include a dummy gate stack 108 that is formed over the semiconductor material of the substrate 101. The dummy gate stack 108 may include a dummy gate insulation material layer 105, a dummy gate electrode material layer 106 and a cap material layer 107. In some embodiments, the dummy gate insulation material layer 105 may include silicon dioxide and/or silicon oxynitride, the dummy gate electrode material layer 106 may include polysilicon and the cap material layer 107 may include silicon nitride.

The trench isolation structure 102 may be formed by means of known techniques for the formation of shallow trench isolation structures, which may include processes of photolithography, etching, oxidation, deposition and/or chemical mechanical polishing.

The logic transistor well 103 and the nonvolatile memory cell well 104 may be formed by means of ion implantation processes, wherein the semiconductor structure 100 is irradiated with dopant ions.

The nonvolatile memory cell well 104 may be P-doped. In some embodiments, the logic transistor 508 formed in the logic transistor region 109 may be an N-channel field effect transistor. In such embodiments, the logic transistor well 103 may also be P-doped. In other parts of the semiconductor structure 100 (not shown), P-channel field effect transistors having N-doped wells may be formed.

In some embodiments, the logic transistor well 103 and the nonvolatile memory cell well 104 may be formed in a common ion implantation process so that substantially equal dopant profiles are obtained in the logic transistor well 103 and the nonvolatile memory cell well 104.

In other embodiments, different dopant profiles may be provided in the logic transistor well 103 and the nonvolatile memory cell well 104 for adapting the nonvolatile memory cell to an operation at higher voltages than the logic transistor.

In such embodiments, the logic transistor region 109 may be covered by a mask, for example, a photoresist mask (not shown), while dopant ions are implanted into the nonvolatile memory cell region 110 for forming the nonvolatile memory cell well 104, and the nonvolatile memory cell region 110 may be covered by a mask while dopant ions are implanted into the logic transistor region 109 for forming the logic transistor well 103.

The dummy gate insulation material layer 105 may be formed by means of a deposition process such as, for example, chemical vapor deposition and/or plasma enhanced vapor deposition. In embodiments wherein the dummy gate insulation material layer 105 includes silicon dioxide, the dummy gate insulation material layer 105, or portions thereof, may be formed by means of an oxidation process wherein the semiconductor structure 100 is exposed to an oxidizing agent, such that the semiconductor material of the substrate 101 is oxidized. The dummy gate electrode material layer 106 and the cap material layer 107 may be formed by means of deposition processes such as chemical vapor deposition and plasma enhanced chemical vapor deposition.

Figure 2:
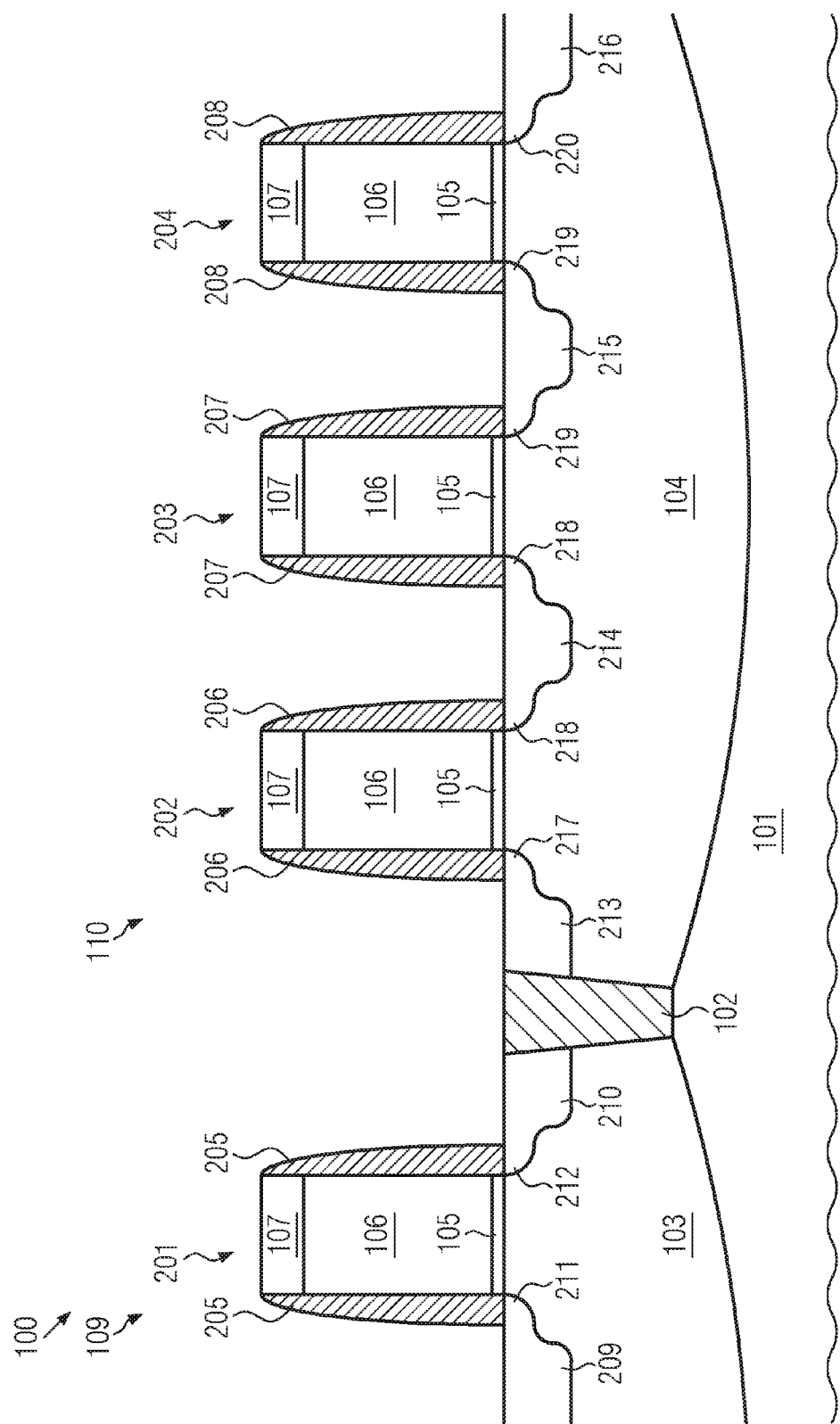

FIG. 2 shows a schematic cross-sectional view of the semiconductor structure 100 in a later stage of the manufacturing process. After the deposition of the materials for the dummy gate stack 108, those layers of material may be patterned to form a dummy gate structure 201 of the logic transistor over the logic transistor region 109, and to form a dummy select gate structure 202, a dummy control gate structure 203 and a dummy transfer gate structure 204 over the nonvolatile memory cell region 110. The patterning of the dummy gate stack 108 may be performed by means of known techniques of photolithography and etching, as conventionally employed in the formation of gate structures in the manufacturing of integrated circuits. In some embodiments, a photoresist mask may be formed over the cap material layer 107 by means of techniques of photolithography. Thereafter, an etch process adapted to remove the cap material of the layer 107 may be performed for forming a hard mask from the cap material layer 107. Then, the photoresist mask may be removed by means of a resist strip process, and an etch process adapted to selectively remove the dummy gate electrode material of the layer 106 relative to the cap material 107 may be performed.

The dummy gate structure 201 of the logic transistor may include a dummy gate electrode formed from a portion of the dummy gate electrode material layer 106, and a dummy gate insulation layer that is provided by a portion of the dummy gate insulation material layer 105 below the dummy gate electrode. Similarly, each of the dummy select gate structure 202, the dummy control gate structure 203 and the dummy transfer gate structure 204 may include a dummy gate electrode formed from a portion of the dummy gate electrode material layer 106 and a dummy gate insulation layer formed from a portion of the dummy gate insulation material layer 105 below the respective dummy gate electrode. The dummy gate insulation material layer 105 can be patterned, wherein portions of the dummy gate insulation layer between the dummy gate structures 201 to 204 are removed. In alternative embodiments, the dummy gate insulation material layer is not removed from the semiconductor structure 100 in the patterning of the dummy gate stack 108, so that portions of the substrate 101 between the dummy gate structures 201 to 204 are covered by the dummy gate insulation material layer 105.

After the patterning of the dummy gate stack 108, sidewall spacers 205, 206, 207 and 208, respectively, may be formed at sidewalls of the dummy gate structures 201, 202, 203 and 204, respectively.

Additionally, a source region 209, which may include a source extension 211, and a drain region 210, which may include a drain extension 212, may be formed in the semiconductor material of the substrate 101 in the logic transistor region 109. Furthermore, source/drain regions 213, 214, 215, 216, which may include source/drain extensions 217, 218, 219, 220, may be formed in the semiconductor material of the substrate 101 in the nonvolatile memory cell region 110. The sidewall spacers 205 to 208 may be formed by substantially isotropically depositing one or more layers of one or more sidewall spacer materials, for example, silicon dioxide and/or silicon nitride, and anisotropically etching each of the one or more layers of sidewall spacer material. Due to the anisotropy of the etch processes, portions of the one or more layers of sidewall spacer material over substantially horizontal portions of the semiconductor structure 100 may be removed. Portions of the one or more layers of sidewall spacer material at the sidewalls of the dummy gate structures 201 to 204 may remain in the semiconductor structure 100 and may form the sidewall spacers 205 to 208.

The source region 209, the source extension 211, the drain region 210, the drain extension 212, the source/drain regions 213 to 216 and the source/drain extensions 217 to 220 may be formed by means of techniques of ion implantation, wherein the semiconductor structure 100 is irradiated with ions of a dopant. A type of the dopant used in these ion implantation processes may be opposite to the type of doping of the logic transistor well 103 and the nonvolatile memory cell well 104. In particular, the semiconductor structure 100 may be irradiated with ions of an N-type dopant. In some embodiments, ion implantations may be performed before the formation of the sidewall spacers 205 to 208 and after the formation of the sidewall spacers 205 to 208, wherein the source extension 211, the drain extension 212 and the source/drain extensions 217 to 220 are formed before the formation of the sidewall spacers 205 to 208 and the source region 209, the drain region 210 and the source/drain regions 213 to 216 are formed after the formation of the sidewall spacers 205 to 208. Thus, a desired dopant profile may be provided.

In some embodiments, separate ion implantation processes maybe performed for forming the source region 209, the drain region 210, the source extension 211 and the drain extension 212 of the logic transistor 109, and the source/drain regions 213, 216 and the source/drain extensions 217, 220 of the nonvolatile memory cell element in the nonvolatile memory cell region 110, on the one hand, and the source/drain regions 214, 215 and the source/drain extensions 218, 219 of the nonvolatile memory cell element, on the other hand. Thus, the source/drain regions 214, 215 and the source/drain extensions 218, 219 may be tuned separately in order to maximize a generation of hot electrons (which are used for programming the nonvolatile memory cell), whereas the source region 209, the drain region 210, the source extension 211 and the drain extension 212 of the logic transistor 109, and the source/drain regions 213, 216 and the source/drain extensions 217, 220 of the nonvolatile memory cell element may be tuned to minimize hot carrier generation.

This may help to improve the performance of the nonvolatile memory cell 707. In some of these embodiments, separate ion implantation processes may be performed for forming the source/drain region 214 and the source/drain extension 218, on the one hand, and for forming the source/drain region 215 and the source/drain extension 219, on the other hand. In further embodiments, a common ion implantation process may be used for the formation of the source region 209, the drain region 210 and the source/drain regions 213 to 216 and a common ion implantation process may be used for forming the source extension 211, the drain extension 212 and the source/drain extensions 217 to 220.

Figure 3:
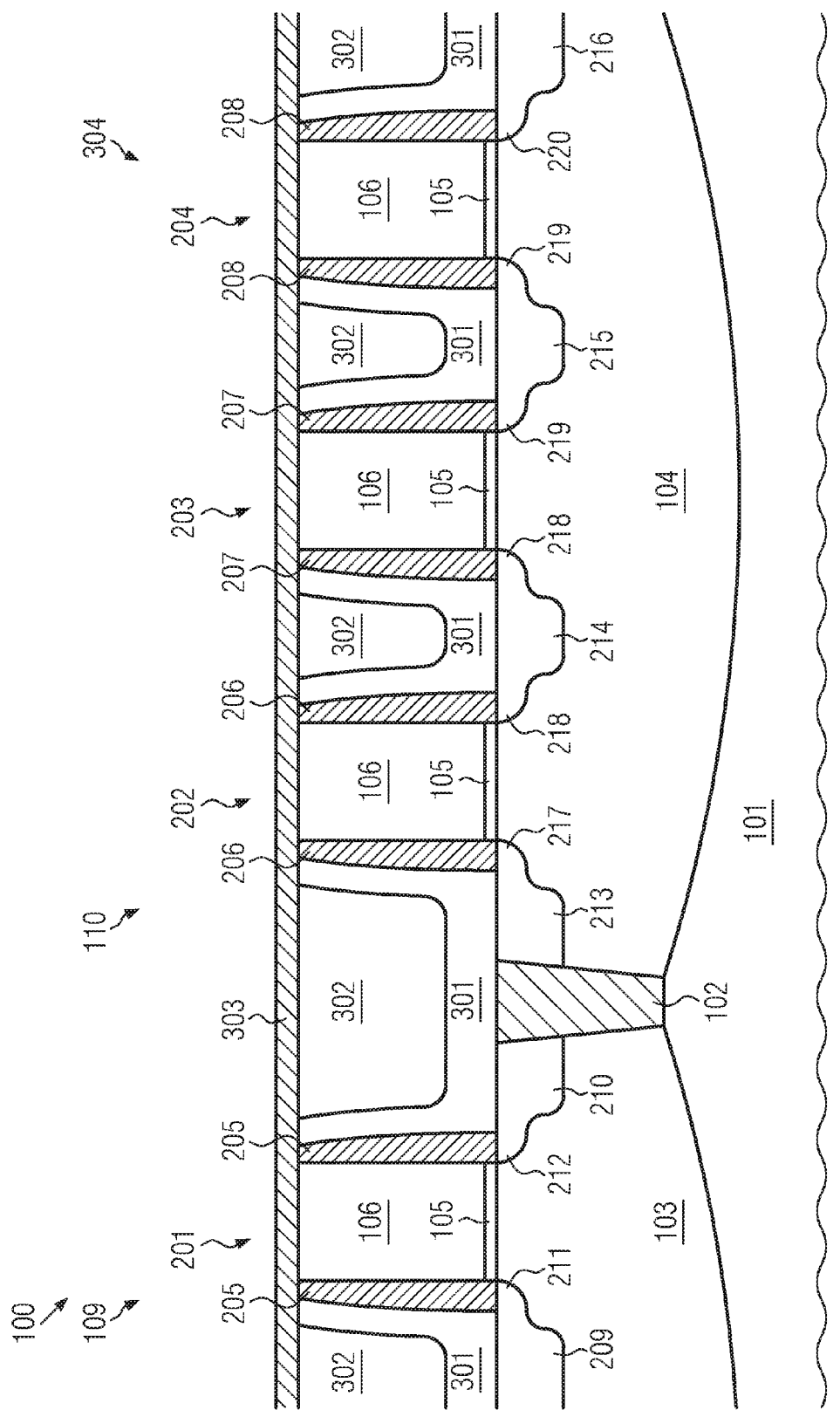

FIG. 3 shows a schematic cross-sectional view of the semiconductor structure 100 in a later stage of the manufacturing process. A liner layer 301 may be deposited over the semiconductor structure 100. The liner layer 301 may be formed of an electrically insulating material, such as, for example, silicon nitride. For forming the liner layer 301, deposition techniques such as chemical vapor deposition and/or plasma enhanced chemical vapor deposition may be used.

Thereafter, an interlayer dielectric 302, which may include silicon dioxide, may be deposited over the semiconductor structure 100 using deposition techniques such as chemical vapor deposition and plasma enhanced chemical vapor deposition.

The interlayer dielectric 302 may fill spaces between the dummy gate structure 201 of the logic transistor, the dummy select gate structure 202, the dummy control gate structure 203 and the dummy transfer gate structure 204. In particular, portions of the interlayer dielectric 302 may be provided between the dummy select gate structure 202 and the dummy control gate structure 203, as well as between the dummy control gate structure 203 and the dummy transfer gate structure 204. Directly after the deposition of the liner layer 301 and the interlayer dielectric 302, the liner layer 301 and the interlayer dielectric 302 may be wrapped around the dummy gate structures 201 to 204. Upper portions of the liner layer 301 and the interlayer dielectric 302 on the dummy gate structures 201 to 204 may be removed, for example, by means of a chemical mechanical polishing process, so that the portions of the cap material layer 107 on the dummy gate structures 201 to 204 are exposed at the surface of the semiconductor structure 100 and a substantially planar surface of the semiconductor structure 100 is obtained.

Thereafter, a blanket recess etch process, which may be an etch process adapted to substantially non-selectively remove the cap material of the layer 107, the materials of the sidewall spacers 205 to 208, the liner layer 301 and the interlayer dielectric 302 may be performed. After the blanket recess etch process, the dummy gate electrodes of the dummy gate structures 201 to 204 that were formed from the dummy gate electrode material layer 106 may be exposed at the surface of the semiconductor structure 100.

Then, a chemical vapor deposition or a plasma enhanced chemical vapor deposition may be performed for forming a layer 303 of a hard mask material over the semiconductor structure 100. In some embodiments, the layer 303 of hard mask material may be formed of silicon dioxide. In other embodiments, the layer 303 of hard mask material may be formed of silicon nitride.

Portions of the sidewall spacers 205 to 208, the liner layer 301 and the interlayer dielectric 302 remaining in the semiconductor structure 100 after the blanket recess etch process may form an electrically insulating structure 304 that extends around the dummy gate structure 201 of the logic transistor, the dummy select gate structure 202, the dummy control gate structure 203 and the dummy transfer gate structure 204. Since the electrically insulating structure 304 does not cover the dummy gate structures 201 to 204, the electrically insulating structure 304 can annularly enclose each of the dummy gate structure 201 of the logic transistor, the dummy select gate structure 202, the dummy control gate structure 203 and the dummy transfer gate structure 204. Since the sidewall spacers 205 to 208, the liner layer 301 and the interlayer dielectric 302 may be formed of different materials, the electrically insulating structure 304 may include portions formed of different materials. In particular, parts of the electrically insulating structure 304 may be formed of silicon dioxide, and other parts of the electrically insulating structure 304 may be formed of silicon nitride.

Figure 4:
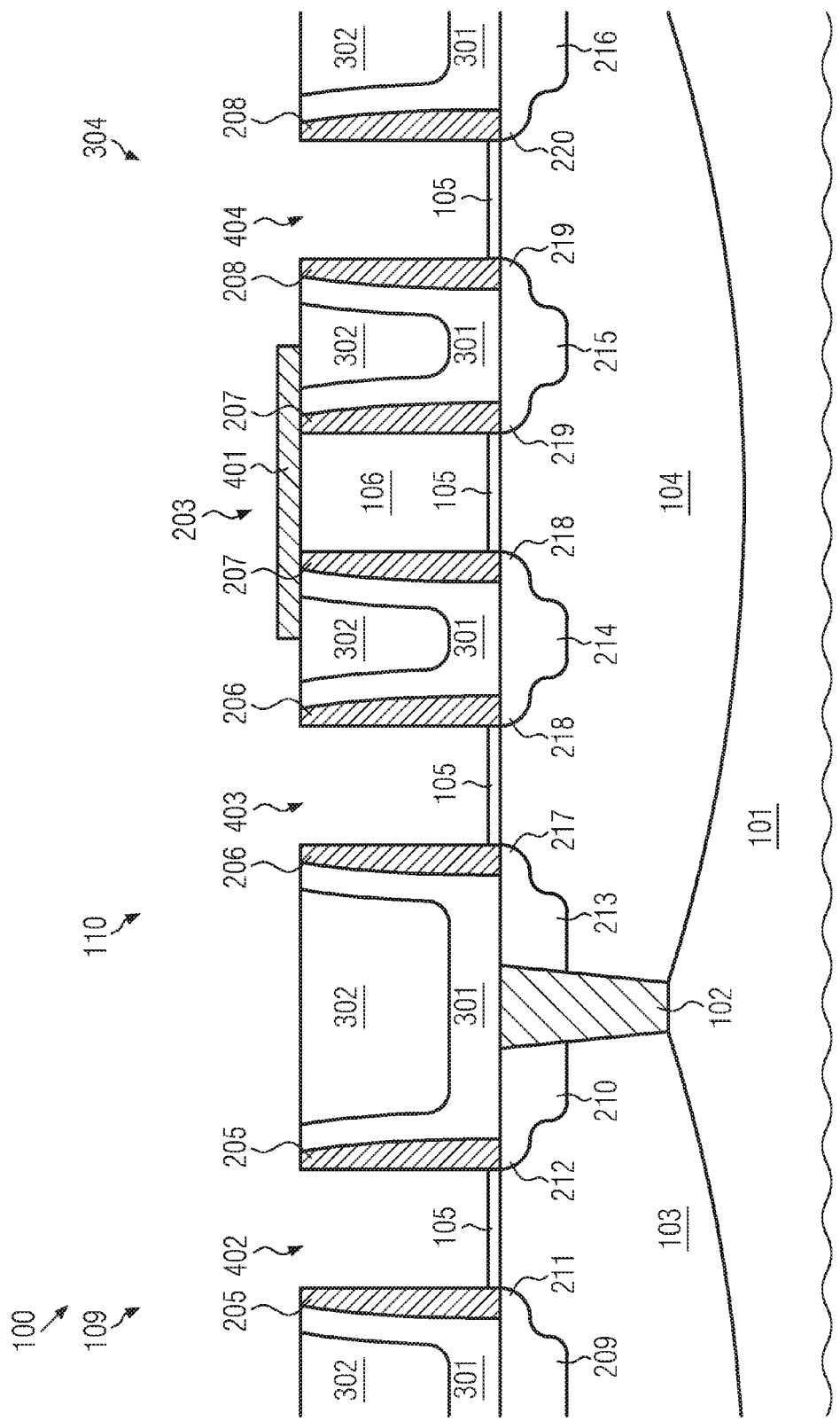

FIG. 4 shows a schematic cross-sectional view of the semiconductor structure 100 in a later stage of the manufacturing process. After the deposition of the layer 303 of hard mask material, the layer 303 of hard mask material may be patterned by means of techniques of photolithography and etching, wherein a hard mask 401 is formed from the layer 303 of hard mask material. The hard mask 401 may cover the dummy control gate structure 203, but not the dummy gate structure 201 of the logic transistor, the dummy select gate structure 202 and the dummy transfer gate structure 204.

Thereafter, one or more etch processes adapted to remove the dummy gate electrode material may be performed. These etch processes may include one or more dry etch processes and/or one or more wet etch processes adapted for selectively removing polysilicon relative to silicon nitride and silicon dioxide. The removal of the dummy gate electrode material in the dummy gate structure 201 of the logic transistor, the dummy select gate structure 202 and the dummy transfer gate structure 204 may form a recess 402 at the location of the dummy gate structure 201 of the logic transistor, a recess 403 at the location of the dummy select gate structure 202 and a recess 404 at the location of the dummy transfer gate structure 204.

The hard mask 401 may protect the dummy control gate structure 203 from being affected by the one or more etch processes performed for removing the dummy gate electrodes of the dummy gate structure 201 of the logic transistor, the dummy select gate structure 202 and the dummy transfer gate structure 204. Thus, the dummy control gate structure 203 may remain in the semiconductor structure 100.

Figure 5:
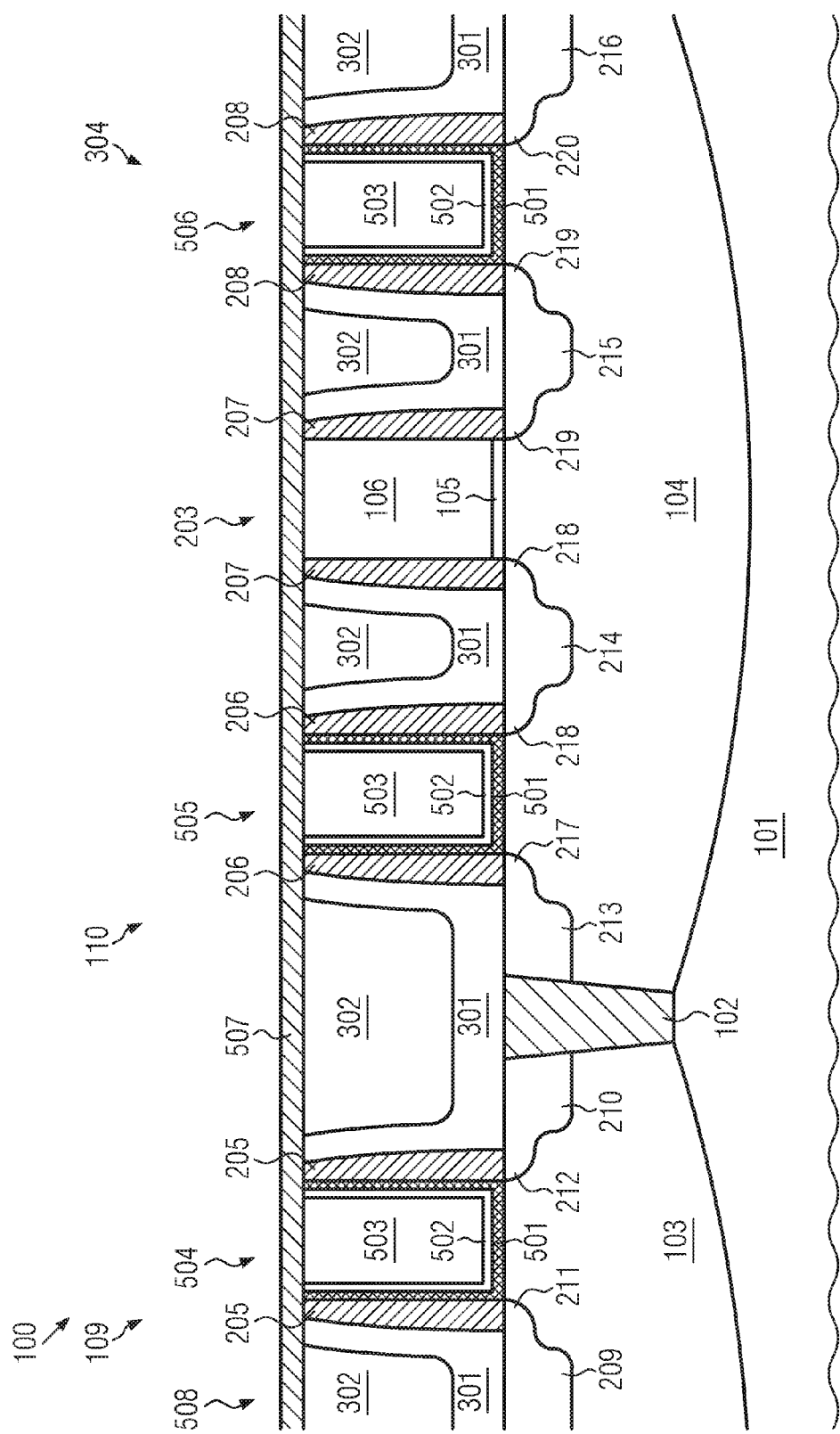

FIG. 5 shows a schematic cross-sectional view of the semiconductor structure 100 in a later stage of the manufacturing process. After the removal of the dummy gate electrodes of the dummy gate structure 201 of the logic transistor, the dummy select gate structure 202 and the dummy transfer gate structure 204, portions of the dummy gate insulation material layer 105 at the bottom of the recesses 402, 403, 404 may be removed, for example, by means of a wet chemical cleaning chemistry that is based on diluted hydrofluoric acid. Thus, the semiconductor material of the substrate 101 may be exposed at the bottom of the recesses 402, 403, 404.

Then, a gate insulation material layer 501 may be deposited over the semiconductor structure 100. The gate insulation material layer 501 may include a high-k dielectric material having a greater dielectric constant than silicon dioxide, for example, a dielectric constant greater than about 4. In some embodiments, the gate insulation material layer 501 may include hafnium dioxide, zirconium dioxide, hafnium silicon oxynitride and/or zirconium silicon oxynitride. In some embodiments, the gate insulation material layer 501 may include sublayers that are formed of different materials, for example, a lower sublayer including silicon dioxide that is deposited directly on the semiconductor material of the substrate 101 exposed at the bottom of the openings 402, 403, 404 and an upper sublayer including a high-k dielectric material that is deposited on the lower sublayer. For forming the gate insulation material layer 501, known techniques for the formation of gate insulation material layers including a high-k dielectric material, which may include processes of oxidation and deposition, may be used.

After the formation of the gate insulation material layer 501, a workfunction adjustment metal layer 502 may be formed over the semiconductor structure 100. The workfunction adjustment metal layer 502 may include a metal that is selected for adapting the workfunction of gate electrodes of N-channel field effect transistors such that it matches the workfunction of the semiconductor material of the substrate 101. In some embodiments, the workfunction adjustment metal layer may include titanium nitride and/or titanium. The workfunction adjustment metal layer 503 need not be a substantially homogenous layer. In some embodiments, the workfunction adjustment metal layer 502 may include sublayers that are formed of different metals, for example, a sublayer of titanium over a sublayer of titanium nitride. For forming the workfunction adjustment metal layer 502, known techniques of dual workfunction adjustment metal patterning may be performed, wherein a workfunction adjustment metal layer that includes at least one different metal than the workfunction adjustment metal layer 502, for example tantalum nitride, is formed over P-channel field effect transistors in the semiconductor structure 100. This may be done using well-known techniques conventionally employed in the formation of logic transistors in accordance with high-k metal gate techniques.

After the formation of the workfunction adjustment metal layer 502, a gate electrode metal layer 503 may be deposited over the semiconductor structure 100. The gate electrode metal layer 503 may include aluminum, titanium and/or tungsten, and it may be formed by means of deposition techniques such as physical vapor deposition, chemical vapor deposition and/or plasma-enhanced chemical vapor deposition. The workfunction adjustment metal layer 502 and the gate electrode metal layer 503 provide a gate electrode material layer over the gate insulation material layer 501. Alternatively, a polysilicon layer may be formed instead of the gate electrode metal layer 503.

Directly after the deposition of the gate insulation material layer 501 and the gate electrode material layer including the workfunction adjustment metal layer 502 and the gate electrode metal layer 503, there may be portions of the gate insulation material layer 501 and the gate electrode material layer on the electrically insulating structure 304. A chemical mechanical polishing process may be performed for removing the portions of the gate insulation material layer 501 and the gate electrode material layer on the electrically insulating structure 304 and the hardmask 401 above the dummy gate structure 203. The chemical mechanical polishing process may be performed down to a level of the dummy gate electrode material layer 106 that provides the dummy gate electrode of the dummy control gate structure 203. Thus, in the chemical mechanical polishing process, portions of the gate insulation material layer 501 and the gate electrode material layer outside the recesses 402, 403, 404 may be removed so that the electrically insulating structure 304 and the portion of the dummy gate electrode material layer 106 providing the dummy gate electrode of the dummy control gate structure 203 are exposed at the surface of the semiconductor structure 100. Portions of the gate insulation material layer 501 and the gate electrode material layer in the recess 402 provide a final gate structure 504 of the logic transistor 508 formed at the logic transistor region 109. Portions of the gate insulation material layer 501 and the gate electrode material layer in the recess 403 provide a select gate structure 505 of the nonvolatile memory cell element at the nonvolatile memory cell region 110, and portions of the gate insulation material layer 501 and the gate electrode material layer in the recess 404 provide a transfer gate structure 506 of the nonvolatile memory cell elements.

After the chemical mechanical polishing process that is performed for removing portions of the gate insulation material layer 501 and the gate electrode material layer over the electrically insulating structure 304, a layer 507 of a hardmask material may be deposited over the semiconductor structure 100. The layer 507 of hardmask material may include silicon dioxide, and it may be formed by means of techniques of chemical vapor deposition and/or plasma-enhanced chemical vapor deposition.

Figure 6:
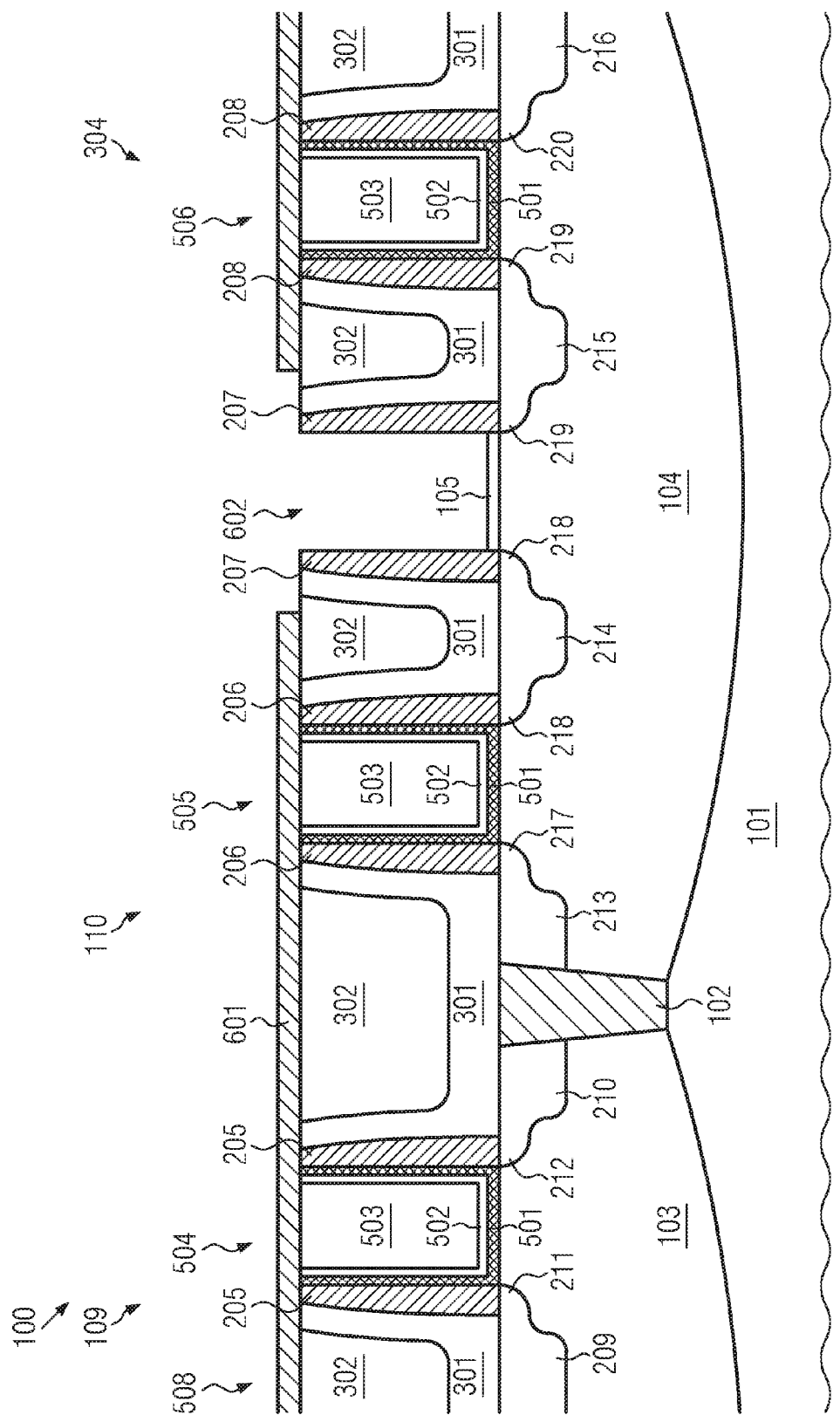

FIG. 6 shows a schematic cross sectional view of the semiconductor structure 100 in a later stage of the manufacturing process. After the deposition of the layer 507 of hardmask material, the layer 507 of hardmask material may be patterned by means of techniques of photolithography and etching for forming a hardmask 601. The hardmask 601 may cover the gate structure 504 of the logic transistor, the select gate structure 505 and the transfer gate structure 506 but not the dummy control gate structure 203.

Then, one or more etch processes adapted for removing the dummy gate electrode material 106 from which the dummy gate electrode of the dummy control gate structure 203 is formed may be performed. In some embodiments, the etch process may include a wet or dry etch process adapted for removing polysilicon. The removal of the dummy gate electrode of the dummy control gate structure 203 may form a recess 602 at the location of the dummy control gate structure 203.

Figure 7:
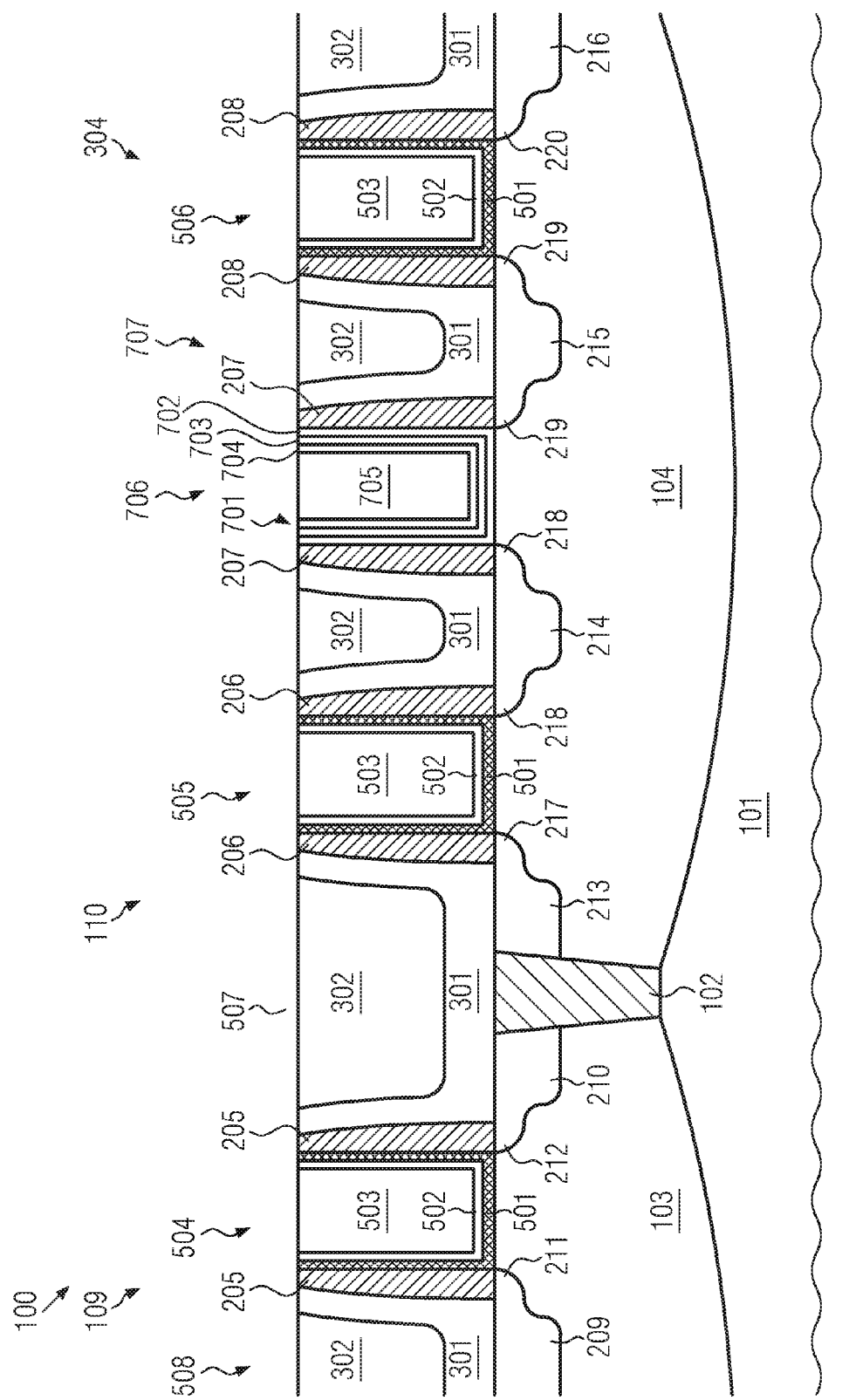

FIG. 7 shows a schematic cross-sectional view of the semiconductor structure 100 at a later stage of the manufacturing process. After the formation of the recess 602, an etch process adapted for removing the portion of the dummy gate insulation material layer 105 at the bottom of the recess 602 may be performed. In some embodiments, the etch process may include a wet etch process wherein the semiconductor structure 100 is exposed to a cleaning chemistry including diluted hydrofluoric acid.

Thereafter, a charge trapping layer 701 may be deposited over the semiconductor structure 100. In some embodiments, the charge trapping layer 701 may include an oxide-nitride-oxide layer having a sublayer 702 including silicon dioxide, a sublayer 703 including silicon nitride and a sublayer 704 including silicon dioxide, wherein the silicon nitride sublayer 703 is arranged between the silicon dioxide sublayers 702, 704.

In other embodiments, the charge trapping layer 701 may include an alumina-nitride-oxide layer including a sublayer of alumina, a sublayer of silicon nitride and a sublayer of silicon dioxide, wherein the silicon nitride sublayer is provided on the alumina layer, and the silicon dioxide sublayer is provided on the silicon nitride sublayer. In some of these embodiments, a titanium layer may be provided below the alumina sublayer, and a polysilicon control gate electrode of the nonvolatile memory cell may be provided, as will be described in more detail below. Thus, a control gate structure having a titanium-alumina-nitride-oxide-silicon (TANOS) configuration may be formed.

In further embodiments, the charge trapping layer 701 may include a silicon-rich silicon dioxide layer, a silicon-rich silicon nitride layer and/or a layer of nanocrystalline silicon, wherein sublayers of other materials may additionally be provided. Further features of the charge trapping layer 701 may correspond to those of charge trapping layers employed in conventional flash memory cells including charge trapping layers.

After the deposition of the charge trapping layer 701, a layer 705 of a control gate electrode material may be deposited over the semiconductor structure 100. In some embodiments, the layer 705 of control gate electrode material may include a metal, for example, tungsten or aluminum. In other embodiments, the layer 705 of control gate electrode material may include polysilicon.

Directly after the deposition of the charge trapping layer 701 and the layer 705 of control gate electrode material, there may be portions of the charge trapping layer 701 and the layer 705 of control gate electrode material over the electrically insulating structure 304. A chemical mechanical polishing process may be performed for removing portions of the charge trapping layer 701 and the layer 705 of control gate electrode material outside the recess 602 that was formed by the removal of the dummy control gate structure 203. Additionally, the chemical mechanical polishing process may remove the hardmask 601. Alternatively, the hardmask 601 may be removed by means of an etch process that is performed after the removal of the control gate structure 203. Portions of the charge trapping layer 701 and the layer 705 of control gate electrode material in the recess 602 provide a control gate structure 706 of the nonvolatile memory cell 707 formed at the nonvolatile memory cell region 110.

Figure 8:
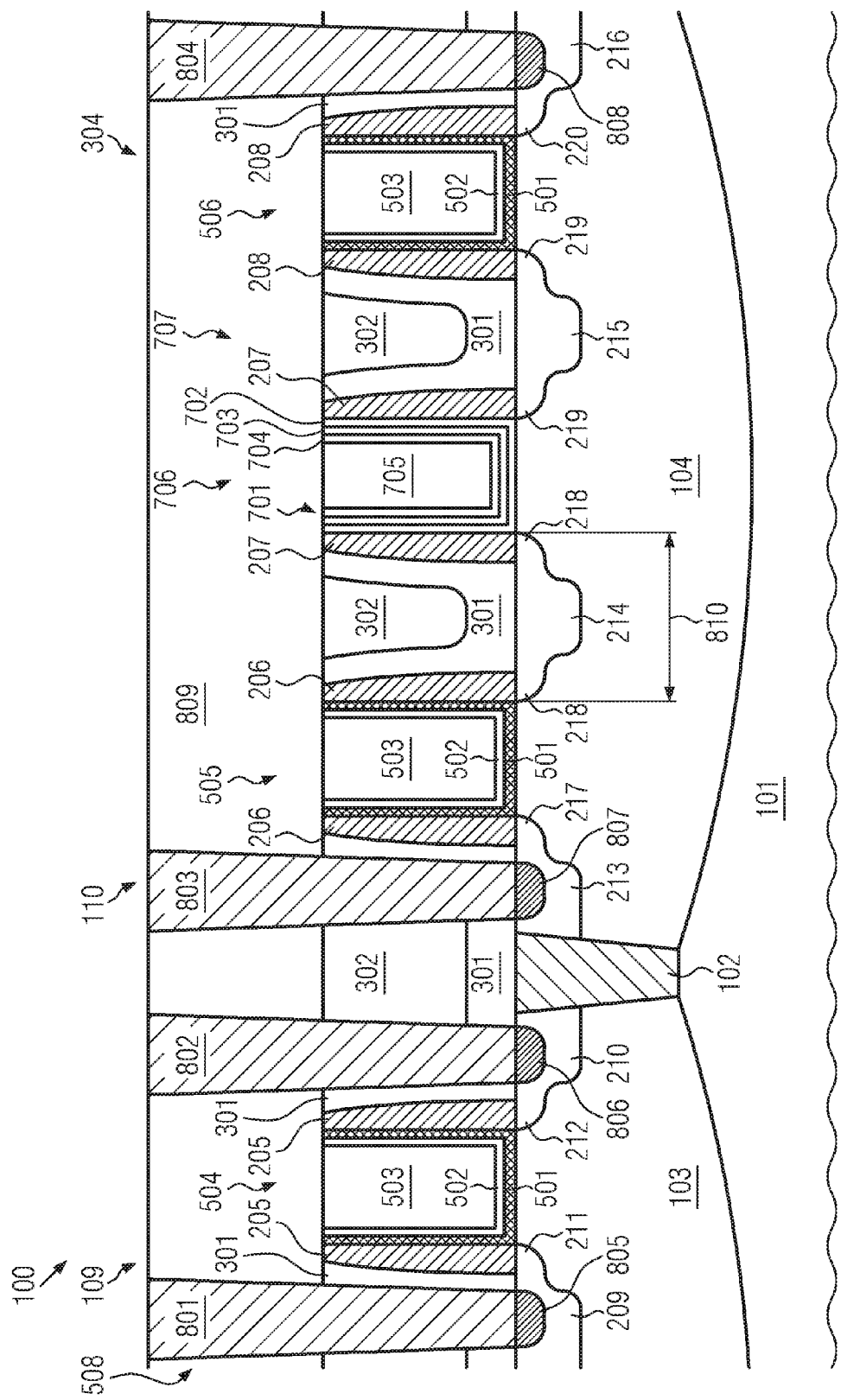

FIG. 8 shows a schematic cross sectional view of the semiconductor structure 100 at a later stage of the manufacturing process. An interlayer dielectric 809 may be deposited over the semiconductor structure 100. The interlayer dielectric 809 may include silicon dioxide, and it may be formed by means of a deposition process such as, for example, chemical vapor deposition or plasma-enhanced chemical vapor deposition.

Thereafter, contact holes 801, 802, 803, 804 may be formed. The contact holes 801 to 804 may be formed by means of processes of photolithography and etching, and they may extend through the interlayer dielectric 809 and the electrically insulating structure 304. The contact hole 801 may be provided over the source region 209, and the semiconductor material of the source region 209 may be exposed at the bottom of the contact hole 801. Similarly, the contact hole 802 may be provided over the drain region 210, and the semiconductor material of the drain region 210 may be exposed at the bottom of the contact hole 802. The contact holes 803, 804 may be provided over the source/drain region 213 and the source/drain region 216, respectively, and the semiconductor material of the source/drain region 213 and the source/drain region 216, respectively, may be exposed at the bottom of the contact hole 803 and the contact hole 804, respectively. Over the source/drain regions 214, 215, no contact holes need to be provided.

After the formation of the contact holes 801 to 804, a silicidation process may be performed for forming a silicide 805 in the source region 209, a silicide 806 in the drain region 210, a silicide 807 in the source/drain region 213 and a silicide 808 in the source/drain region 216. For this purpose, a layer of a metal, for example, a layer of nickel or titanium, may be deposited over the semiconductor structure 100. Thereafter, one or more annealing processes may be performed for inducing a chemical reaction between the metal and the semiconductor material of the source region 209, the drain region 210 and the source/drain regions 213, 216. In the chemical reaction, silicide may be formed. Thereafter, an etch process adapted for removing unreacted metal may be performed, and the contact holes 801 to 804 may be filled with an electrically conductive material, for example, a metal such as tungsten. This may be done by means of known techniques for the formation of contacts to circuit elements in semiconductor structures which may include processes of deposition and chemical mechanical polishing.

In FIG. 8, reference numeral 810 schematically denotes a spacing between the select gate structure 505 and the control gate structure 706. A spacing between the control gate structure 706 and the transfer gate structure 506 may be approximately equal to the spacing 810 between the select gate structure 505 and the control gate structure 706. The spacing 810 between the select gate structure 505 and the control gate structure 706, as well as the spacing between the control gate structure 706 and the transfer gate structure 506 may be provided on the basis of a nominal pitch of the technology employed for forming the logic transistor 508. The pitch corresponds to a distance from mid-gate to mid-gate of adjacent logic transistors, so that the pitch is substantially equal to a sum of a gate length of the logic transistors and the spacing between gate structures of adjacent logic transistors.

Figure 9:
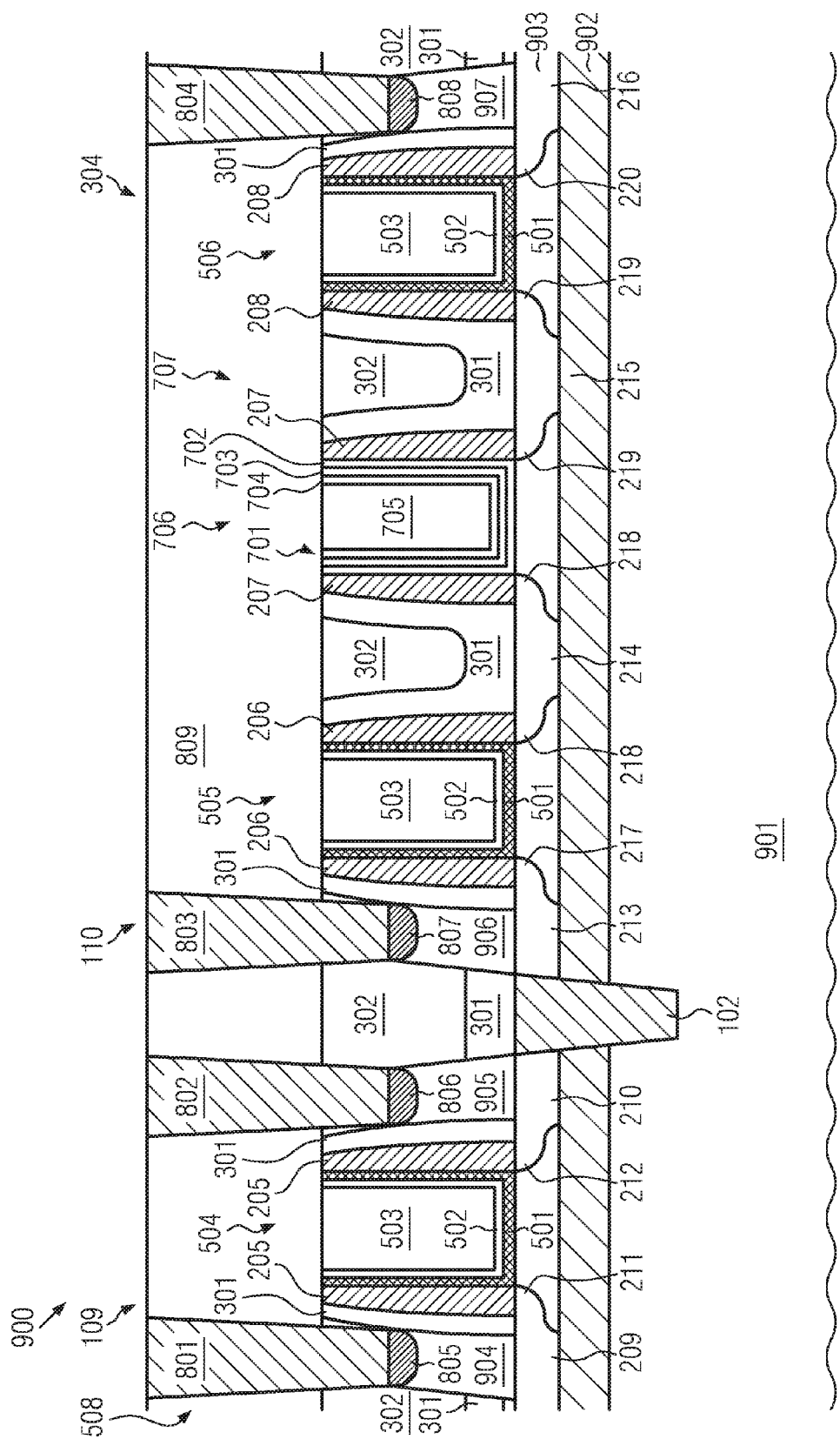
FIG. 9 shows a schematic cross-sectional view of a semiconductor structure according to one illustrative embodiment disclosed herein.

FIG. 9 shows a schematic cross-sectional view of a semiconductor structure 900 according to an embodiment. For convenience, in FIGS. 1-8, on the one hand, and in FIG. 9, on the other hand, like reference numerals have been used to denote like components. Unless explicitly stated otherwise, components denoted by like reference numerals may have corresponding features and corresponding methods may be used for the formation thereof. Therefore, a detailed description thereof will sometimes be omitted. The semiconductor structure 900 includes a fully depleted semiconductor-on-insulator structure. The fully depleted semiconductor-on-insulator structure includes a semiconductor layer 903 that is formed over a support wafer 901 and separated from the support wafer by a layer 902 of electrically insulating material. In some embodiments, the layer 903 of semiconductor material may include silicon, the layer 902 of electrically insulating material may include silicon dioxide, and the support wafer 901 may be a silicon wafer. A thickness of the layer 903 of semiconductor material may be adapted such that a full depletion of portions of the layer 903 of semiconductor material arranged in the channel region of the field effect transistors formed in the semiconductor structure 900 may be obtained in the operation of the field effect transistors. In some embodiments, the layer 903 of semiconductor material may have a thickness in a range from about 5-30 nm, for example, in a range from about 5-10 nm.

Similar to the semiconductor structure 100 described above with reference to FIGS. 1-8, the semiconductor structure 900 includes a nonvolatile memory cell 707 and a logic transistor 508, which may be an N-channel field effect transistor. The nonvolatile memory cell 707 includes an active region provided in the semiconductor material of the layer 903. The active region includes source/drain regions 213, 214, 215, 216. In some embodiments, source/drain extensions 217, 218, 219, 220 may be provided at the source/drain regions 213 to 216. The nonvolatile memory cell 707 further includes a select gate structure 505 between the source/drain regions 213, 214, a control gate structure 706 between the source/drain regions 214, 215 and a transfer gate structure 506 between the source/drain regions 215, 216.

The logic transistor 508 may include an active region provided in the semiconductor material of the layer 903. The active region of the logic transistor 508 may include a source region 209, a drain region 210 and optionally a source extension 211 and a drain extension 212. Between the source region 209 and the drain region 210, a gate structure 504 of the logic transistor 508 may be provided.

Each of the gate structure 504 of the logic transistor, the select gate structure 505 and the transfer gate structure 506 may include a gate insulation material layer 501, a workfunction adjustment metal layer 502 and gate electrode metal layer 503. The control gate structure 706 may include a charge trapping layer 701, which may have sublayers 702, 703, 704, and a layer 705 of control gate electrode material. Adjacent to each of the gate structure 504 of the logic transistor 508, the select gate structure 505, the control gate structure 706 and the transfer gate structure 506, respective sidewall spacers 205, 206, 207, 208 may be provided. The semiconductor structure 900 may further include residues of a dummy gate insulation material layer 105 and a liner layer 301.

The above-described features of the semiconductor structure 900 may be formed using techniques corresponding to those described above with reference to FIGS. 1-8, wherein, however, in some embodiments, there may be differences relating to the formation of the source region 209, the drain region 210, the source extension 211 and the drain extension 212 of the logic transistor 504 and at least some of the source/drain regions 213 to 216 and source/drain extensions 217 to 220 of the nonvolatile memory cell 707, as will be detailed below.

The semiconductor structure 900 may further include a raised source region 904 over the source region 209 of the logic transistor 508 and a raised drain region 905 over the drain region 210 of the logic transistor 508. Over the source/drain regions 213, 216 of the nonvolatile memory cell 707, raised source/drain regions 906, 907 may be provided. Over the source/drain regions 214, 215 of the nonvolatile memory cell 707, no raised source/drain regions need to be formed. For forming the raised source region 904, the raised drain region 905 and the raised source/drain regions 906, 907, selective epitaxial growth processes may be used, which are adapted such that a deposition of semiconductor material is obtained only on exposed semiconductor material of the layer 903 of semiconductor material, but substantially no deposition of semiconductor material is obtained on other materials such as silicon dioxide and/or silicon nitride. In some embodiments, layers of sidewall spacer material that are employed for forming the sidewall spacers 205, 206, 207, 208 may be used for covering portions of the semiconductor structure 900 where no semiconductor material is to be deposited in the selective epitaxial growth. The raised source region 904, the raised drain region 905 and the raised source/drain regions 906, 907 may be N-doped. In other portions of the semiconductor structure 900, P-channel field effect transistors having P-doped raised source and drain regions may be provided. Two separate selective epitaxial growth processes may be used for depositing N-doped semiconductor material over N-channel field effect transistors such as the logic transistor 504 and nonvolatile memory cells such as the nonvolatile memory cell 707, and for depositing P-doped semiconductor material over the P-channel field effect transistors. For avoiding a deposition of semiconductor material of the wrong doping over portions of the semiconductor structure 900, photoresist masks may be formed over the semiconductor structure 900 after the deposition of layers of sidewall spacer material and before anisotropic etch processes performed for forming sidewall spacers such as the sidewalls spacers 205 to 208 therefrom, wherein the photoresist masks protect portions of the layers of sidewall spacer material from being etched. Hence, portions of the semiconductor structure 900 may be covered by parts of the layers of sidewall spacer material, which may prevent a deposition of semiconductor material in a subsequent selective epitaxial growth process. Thus, a deposition of N-doped semiconductor material over P-channel transistors, and a deposition of P-doped semiconductor material over the logic transistor 504 and the nonvolatile memory cell 707 may be avoided. Additionally, a deposition of semiconductor material over the source/drain regions 214, 215 may be avoided, so that no raised source/drain regions are formed over the source/drain regions 214, 215.

In some embodiments, in particular in embodiments wherein the semiconductor layer 903 has a relatively small thickness in a range from about 5-10 nm, the source region 209, the drain region 210 and the source/drain regions 213, 216 may be formed by performing an outdiffusion process wherein the semiconductor structure 900 is exposed to an elevated temperature so that dopants from the raised source region 904, the raised drain region 905 and the raised source/drain regions 906, 907 diffuse into portions of the semiconductor layer 903 therebelow. In such embodiments, the source extension 211, the drain extension 212 and the source/drain extensions 217, 220 may be omitted. The source/drain regions 214, 215 and, optionally, source/drain extensions 218, 219 may be formed by means of ion implantation as described above with reference to FIG. 2. Alternatively, the source region 209, the drain region 210, the source/drain regions 213, 216 and, optionally, the source extension 211, the drain extension 212 and the source/drain extensions 217, 220 may be formed by means of ion implantation.

After the formation of the raised source region 904, the raised drain region 905 and the raised source/drain regions 906, 907, the liner layer 301 may be formed. The semiconductor structure 900 may further include interlayer dielectrics 302, 809, contact holes 801, 802, 803, 804 filled with an electrically conductive material that are provided over the raised source region 904, the raised drain region 905 and the raised source/drain regions 906, 907. A silicide 805, 806, 807 and 808, respectively, may be provided in each of the raised source region 904, the raised drain region 905 and the raised source/drain regions 906, 907. These features may be formed as described above with reference to FIGS. 1-8. In particular, the silicide 805, 806, 807 and 808 may be formed by means of a silicidation process that is performed after the formation of the contact holes 801 to 804 and before the filling of the contact holes 801 to 804 with the electrically conductive material.

The sidewall spacers 205 to 208, the liner layers 301 and the interlayer dielectric 302 provide an electrically insulating structure 304 that annularly encloses each of the gate structure 504 of the logic transistor 508, the select gate structure 505, the control gate structure 706 and the transfer gate structure 506.

The present disclosure is not limited to embodiments wherein a full gate replacement process is performed for forming gate structures of logic transistors and select gate structures and transfer gate structures of nonvolatile memory cells. In other embodiments, a hybrid replacement gate approach may be used, wherein dummy gate electrodes of gate structures of logic transistors, and dummy gate electrodes of select gate structures and transfer gate structures of nonvolatile memory cells are replaced, but no replacement of gate insulation layers of gate structures of logic transistors, select gate structures and transfer gate structures is performed. In particular, a high-k gate insulation layer and a titanium nitride cap formed thereon need not be removed. In the following, such embodiments will be described with reference to FIGS. 10-13. Similar to the embodiments described with reference to FIGS. 1-8, on the one hand, and FIG. 9 on the other hand, in some embodiments, bulk semiconductor substrates may be used, as will be described in the following with reference to FIGS. 10-12, and, in other embodiments, semiconductor-on-insulator substrates may be used, as will be described with reference to FIG. 13. For convenience, in FIGS. 1-9, on the one hand, and in FIGS. 10-13, on the other hand, like reference numerals have been used to denote like components. Components denoted by like reference numerals may have corresponding features, and corresponding methods may be used for the formation thereof. Hence, a detailed description thereof will sometimes be omitted.

Figure 10:
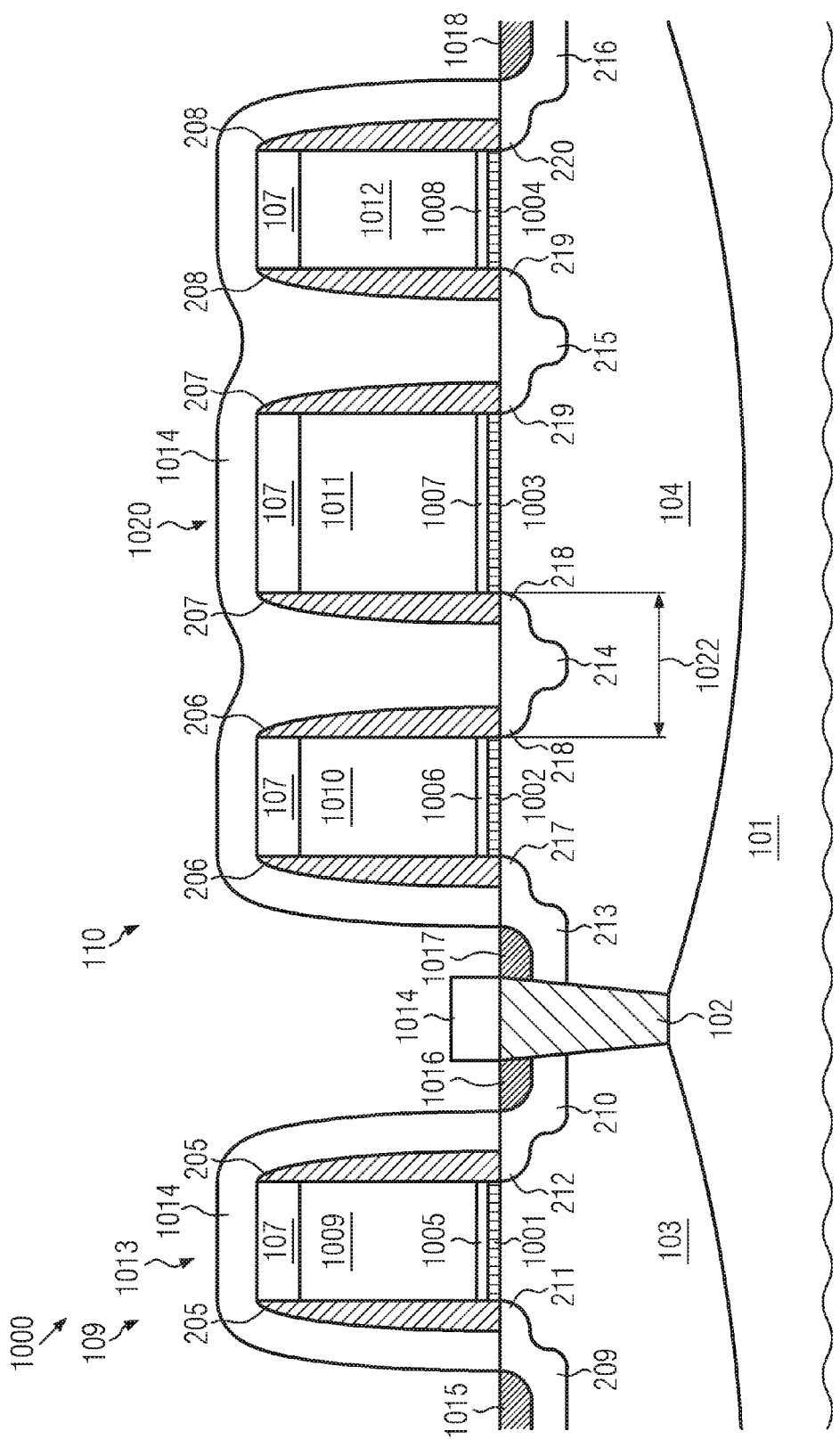
FIGS. 10-12 show schematic cross-sectional views of a semiconductor structure according to an embodiment in stages of a method according to one illustrative embodiment disclosed herein.

FIG. 10 shows a schematic cross-sectional view of a semiconductor structure 1000 according to an embodiment in a stage of a method of manufacturing a semiconductor structure according to an embodiment. The semiconductor structure 1000 may include a bulk semiconductor substrate 101, wherein a logic transistor well 103 and a nonvolatile memory cell well 104 are provided in a logic transistor region 109 and a nonvolatile memory cell region 110, respectively. A trench isolation structure 102 may provide an electrical insulation between the logic transistor well 103 in the logic transistor region 109 and the nonvolatile memory cell well 104 in the nonvolatile memory cell region 110.

In the logic transistor region 109, a gate insulation layer 1001 of a logic transistor may be provided. Over the gate insulation layer 1001, a dummy gate electrode 1009 may be provided, which may be separated from the gate insulation layer 1001 by a metal cap layer 1005.

In the nonvolatile memory cell region 110, a select gate insulation layer 1002, a dummy control gate insulation layer 1003 and a transfer gate insulation layer 1004 may be provided. Over the select gate insulation layer 1002, a dummy select gate electrode 1010 may be provided, which may be separated from the select gate insulation layer 1002 by a metal cap layer 1006. Over the dummy control gate insulation layer 1003, a metal cap layer 1007 and a dummy control gate electrode 1011 may be provided. Over the transfer gate insulation layer 1004, a metal cap layer 1008 and a dummy transfer gate electrode 1012 may be provided. The dummy control gate insulation layer 1003, the metal cap layer 1007 and the dummy control gate electrode 1011 provide a dummy control gate structure 1020 that will be replaced by a control gate structure of a nonvolatile memory cell in later stages of the manufacturing process. In some embodiments, a cap material layer 107 may be provided over each of the dummy gate electrodes 1009-1012.

The gate insulation layer 1001 of the logic transistor, the select gate insulation layer 1002, the dummy control gate insulation layer 1003 and the transfer gate insulation layer 1004 may be portions of one gate insulation material layer. The metal cap layers 1005 to 1008 may be portions of one metal cap material layer, and the dummy gate electrodes 1009 to 1012 may be portions of one dummy gate electrode material layer, wherein the gate insulation material layer, the metal cap material layer, the dummy gate electrode material layer and the cap material layer 107 may be provided in the form of a layer stack 1013 that is deposited over the semiconductor material of the substrate 101 and patterned by means of techniques of photolithography and etching to form the gate insulation layers 1001 to 1004, the metal cap layers 1005 to 1008 and the dummy gate electrodes 1009 to 1012.

The gate insulation material from which the gate insulation layers 1001 to 1004 are formed may include a high-k dielectric material, such as hafnium dioxide, zirconium dioxide, hafnium silicon oxynitride and/or zirconium silicon oxynitride and, optionally, other materials such as silicon dioxide and/or silicon oxynitride, and it may be formed by means of techniques of atomic layer deposition, chemical vapor deposition, plasma enhanced chemical vapor deposition and/or oxidation.

The metal cap material layer from which the metal cap layers 1005 to 1008 are formed may include a metal or a metal compound, such as titanium nitride and it may be formed by means of atomic layer deposition, chemical vapor deposition and/or plasma enhanced chemical vapor deposition.

The dummy gate electrode material layer, from which the dummy gate electrodes 1009 to 1012 are formed, may include polysilicon and may be formed by means of chemical vapor deposition or plasma enhanced chemical vapor deposition.

Adjacent to the dummy gate electrode 1009 of the logic transistor, a sidewall spacer 205 may be provided. Similarly, sidewall spacers 206, 207, 208 may be provided adjacent to the dummy select gate electrode 1010, the dummy control gate electrode 1011 and the dummy transfer gate electrode 1012, respectively.

In the logic transistor region 109, a source region 209, a drain region 210, a source extension 211 and a drain extension 212 may be provided. In the nonvolatile memory cell region 110, source/drain regions 213, 214, 215, 216 and source/drain extensions 217, 218, 219, 220 may be provided. After the formation of the source region 209, the drain region 210, the source extension 211, the drain extension 212, the source/drain regions 213 to 216, the source/drain extensions 217 to 220 and the sidewall spacers 205 to 208, which may be performed as described above with reference to FIG. 2, a silicide block layer 1014 may be deposited over the semiconductor structure 1000. The silicide block layer 1014 may include silicon nitride, and it may be formed by means of deposition techniques such as chemical vapor deposition or plasma enhanced chemical vapor deposition.

The silicide block layer 1014 may have a thickness that is adapted such that a space between the dummy select gate electrode 1010 and the dummy control gate electrode 1011 as well as a space between the dummy control gate electrode 1011 and the dummy transfer gate electrode 1012 are filled with the silicide block layer 1014. For this purpose, a relatively small spacing may be provided between the dummy select gate electrode 1010 and the dummy control gate electrode 1011 and between the dummy control gate electrode 1011 and the dummy transfer gate electrode 1012. In FIG. 10, reference numeral 1022 denotes the spacing between the dummy select gate electrode 1010 and the dummy control gate electrode 1011. The spacing between the dummy control gate electrode 1011 and the dummy transfer gate electrode 1012 may be approximately equal to the spacing 1022.

The relatively small spacing 1022 may be obtained by providing a pitch between the dummy select gate electrode 1010 and the dummy control gate electrode 1011, and between the dummy control gate electrode 1011 and the dummy transfer gate electrode 1012 that is smaller than a nominal pitch provided between gate electrodes of adjacent logic transistors formed in the semiconductor structure 1000. Accordingly, the dummy select gate electrode 1010, the dummy control gate electrode 1011 and the dummy transfer gate electrode 1012 may be provided at a sub-nominal pitch. Due to the sub-nominal pitch, the spaces between the dummy select gate electrode 1010, the dummy control gate electrode 1011 and the dummy transfer gate electrode 1012 may be filled with the silicide block layer 1014, whereas spaces between dummy gate electrodes of adjacent logic transistors need not be filled with the silicide block layer 1014.

After the deposition of the silicide block layer 1014, the silicide block layer 1014 may be patterned by means of techniques of photolithography and etching for removing portions of the silicide block layer 1014 over the source region 209, the drain region 210 and the source/drain regions 213, 216. The source/drain regions 214, 215 may be covered by the silicide block layer 1014 filing the spaces between the dummy select gate electrode 1010, the dummy control gate electrode 1011 and the dummy transfer gate electrode 1012.

After the patterning of the silicide block layer 1014, a silicidation process may be performed, wherein a layer of a metal such as nickel is deposited over the semiconductor structure and one or more annealing processes are performed for inducing a chemical reaction between the metal and the semiconductor material of the substrate 101. Unreacted metal may be removed by means of an etch process. In the silicidation process, silicide 1015, 1016, 1017, 1018 may be formed in the source region 209, the drain region 210 and the source/drain regions 213, 216, respectively. In the source/drain regions 214, 215, no silicide needs to be formed.

Figure 11:
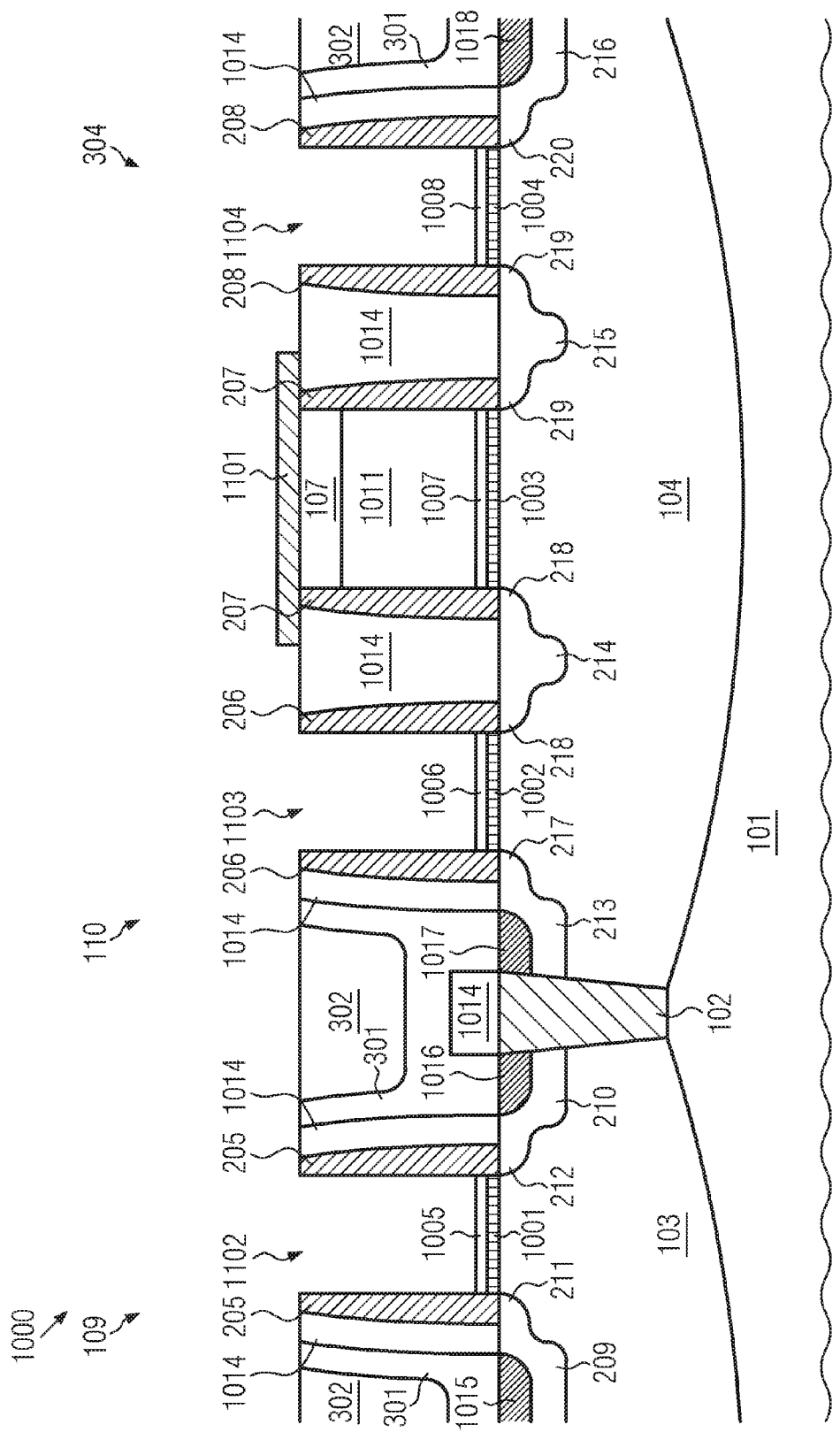

FIG. 11 shows a schematic cross-sectional view of the semiconductor structure 1000 in a later stage of the manufacturing process. After the silicidation process, a liner layer 301 and an interlayer dielectric 302 may be deposited over the semiconductor structure, and a chemical/mechanical polishing process may be performed for removing portions of the silicide block layer 1014 and the interlayer dielectric 302 over the dummy gate electrodes 1009, 1010, 1011, 1012. Portions of the sidewall spacers 205 to 208, the silicide block layer 1014 and the interlayer dielectric 302 remaining in the semiconductor structure 1000 may provide an electrically insulating structure 304 annularly enclosing the dummy gate electrodes 1009 to 1012.

A hard mask 1101 may be formed over the dummy control gate electrode 1011. The hard mask 1101 may include silicon dioxide or silicon nitride, and it may be formed by depositing a layer of a material of the hard mask 1101 over the semiconductor structure 1000 and patterning the layer of the material of the hard mask 1101 by techniques of photolithography and etching.

After the formation of the hard mask 1101, an etch process adapted to selectively remove the material of the dummy gate electrodes 1009, 1010, 1012 relative to the material of the metal cap layers 1005, 1006, 1008 may be performed for removing the dummy gate electrodes 1009, 1010, 1012. Thus, a recess 1102 is formed at the location of the dummy gate electrode 1009 of the logic transistor, a recess 1103 is formed at the location of the dummy select gate electrode 1010 and a recess 1114 is formed at the location of the dummy transfer gate electrode 1012.

Figure 12:
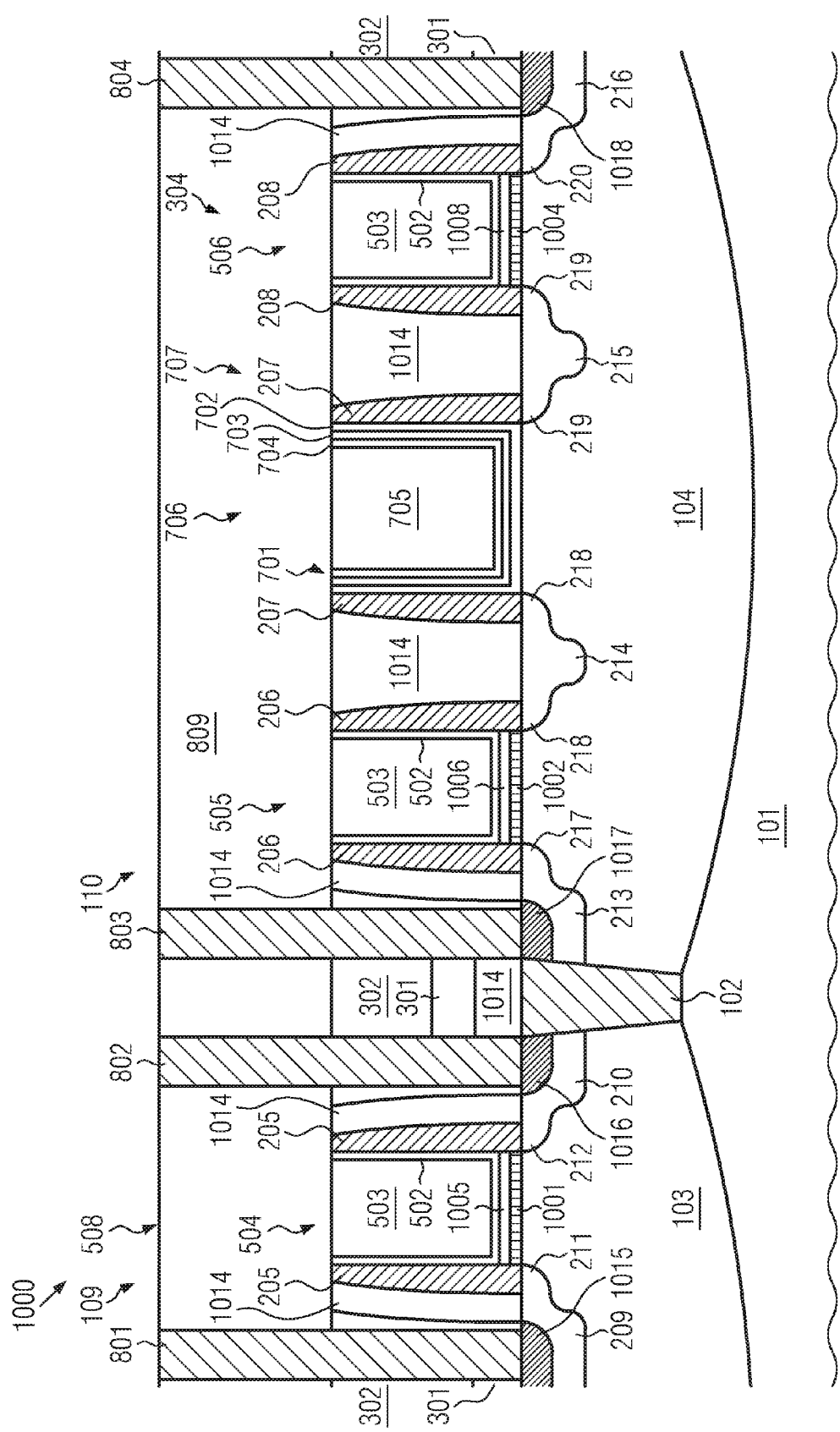

FIG. 12 shows a schematic cross-sectional view of the semiconductor structure 1000 in a later stage of the manufacturing process. After the removal of the dummy gate electrodes 1009, 1010, 1012, a workfunction adjustment metal layer 502 and a gate electrode metal layer 503 may be deposited over the semiconductor structure 1000 and portions of the workfunction adjustment metal layer 502 and the gate electrode metal layer 503 outside the recesses 1102, 1103, 1104 and, optionally, the hard mask 1101 may be removed by means of a chemical mechanical polishing process. Portions of the workfunction adjustment metal layer 502 and the gate electrode metal layer 503 in the recesses 1102, 1103, 1104 provide a gate electrode of a logic transistor 508 formed at the logic transistor region 109 as well as a select gate electrode and a transfer gate electrode of a nonvolatile memory cell 707 formed in the nonvolatile memory cell region 110. Thus, a gate structure 504 of the logic transistor 508, a select gate structure 505 and a transfer gate structure 506 may be provided.

Thereafter, the gate structures 504, 505, 506 may be covered by a hard mask, wherein the hard mask does not cover the dummy gate electrode 1011. Then, the dummy control gate structure provided by the dummy control gate insulation layer 1003, the metal cap layer 1007 and the dummy control gate electrode 1011 may be removed by one or more etch processes, a charge trapping layer 701 including sublayers 702, 703, 704 and a layer 705 of control gate electrode material may be deposited, and portions of the charge trapping layer 701 and the layer 705 of control gate electrode material outside the recess formed by the removal of the dummy control gate structure 1011 may be removed by means of a chemical mechanical polishing process. Thereafter, an interlayer dielectric 809 may be deposited over the semiconductor structure and contact holes 801 to 804 filled with an electrically conductive material may be formed for providing electrical connections to the source region 209, the drain region 210 and the source/drain regions 213, 216.

In some embodiments, before the removal of the dummy gate electrodes 1009, 1010, 1012, dummy gate electrodes of P-channel transistors in the semiconductor structure 1000 may be removed, and gate electrodes of the P-channel transistors may be formed by depositing a workfunction adjustment metal layer for P-channel transistors and a gate electrode metal layer, and performing a chemical mechanical polishing process.

Figure 13:
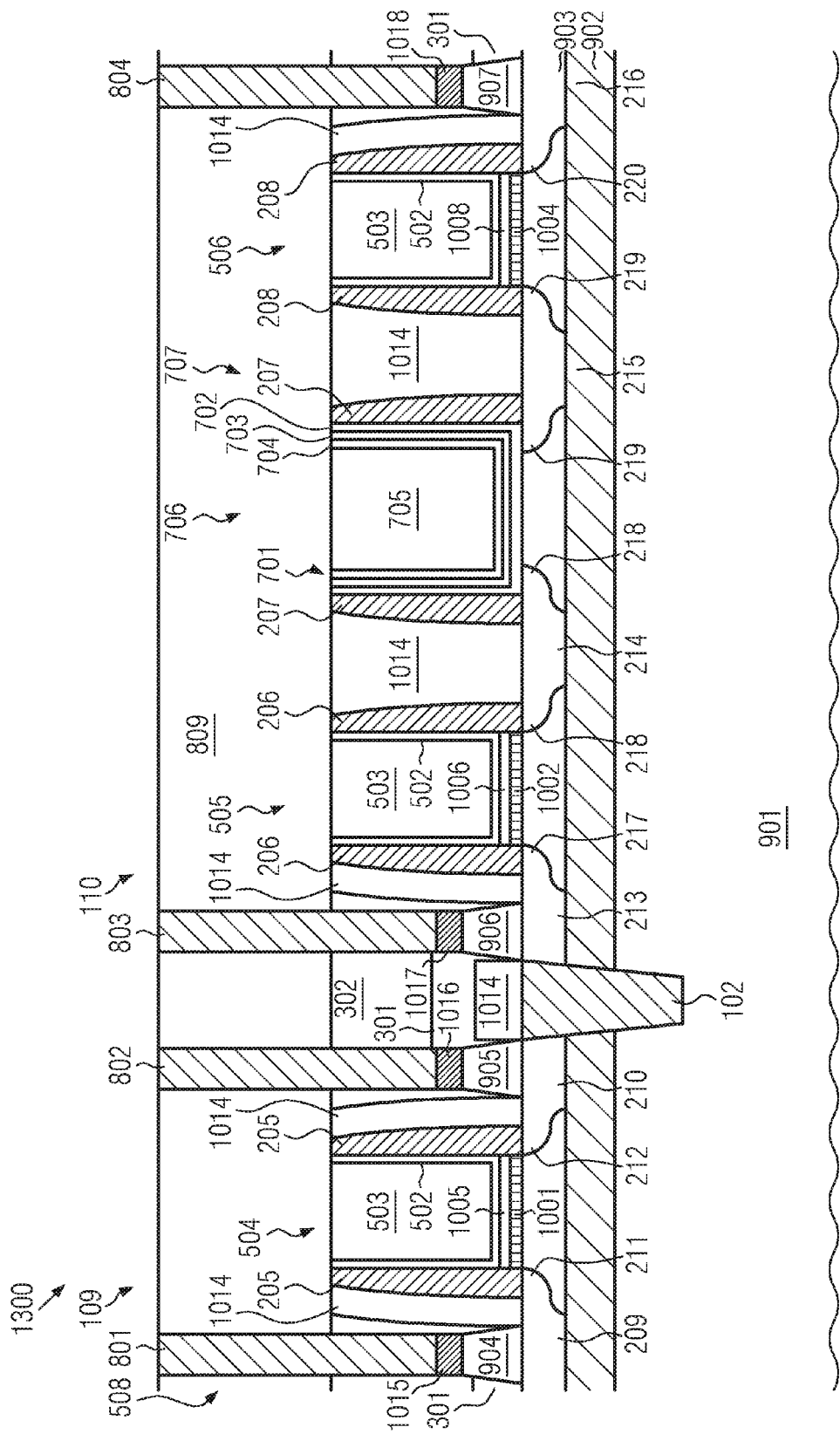
FIG. 13 shows a schematic cross-sectional view of a semiconductor structure according to another illustrative embodiment disclosed herein.

FIG. 13 shows a schematic cross-sectional view of a semiconductor structure 1300 according to an embodiment. For convenience, in FIGS. 1-12, on the one hand, and in FIG. 13, on the other hand, like reference numerals have been used to denote like components. Unless explicitly indicated otherwise, components denoted by like reference numerals may have corresponding features, and corresponding methods may be used for the formation thereof. Hence, a detailed description thereof will sometimes be omitted. The semiconductor structure 1300 may include a fully depleted semiconductor-on-insulator substrate including a layer 903 of semiconductor material, a layer 902 of electrically insulating material and a support wafer 901.

A trench isolation structure 102 may provide electrical insulation between a logic transistor region 109, wherein a logic transistor 508 is formed, and a nonvolatile memory cell region 110, wherein a nonvolatile memory cell 707 is formed.

The logic transistor 508 may include an active region provided in the layer 903 of semiconductor material, wherein the active region includes a source region 209, a drain region 210 and a channel region below a gate structure 504 of the logic transistor. Optionally, the active region of the logic transistor 508 may also include a source extension 211 and a drain extension 212.

The nonvolatile memory cell 707 includes an active region provided in the layer 903 of semiconductor material, wherein the active region may include source/drain regions 213, 214, 215, 216, and optionally source/drain extensions 217, 218, 219, 220. Additionally, the nonvolatile memory cell 707 may include a select gate structure 505, a control gate structure 706 and a transfer gate structure 506. Below each of the gate structures 505, 706, 506, a channel region may be provided in the active region.

A raised source region 904 may be provided over the source region 209, a raised drain region 905 may be provided over the drain region 210, and raised source/drain regions 906, 907 may be provided over each of the source/drain regions 213, 216. In the raised source region 904, the raised drain region 905 and the raised source/drain regions 906, 907, a silicide 1015, 1016, 1017, 1018 may be provided, and contact holes 801, 802, 803, 804 extending through interlayer dielectrics 302, 809 and providing electrical connections to the raised source region 904, the raised drain region 905 and the raised source/drain regions 906, 907 may be provided. Over the source/drain region 214 between the select gate structure 505 and the control gate structure 706, and over the source/drain region 215 between the control gate structure 706 and the transfer gate structure 506, no raised source/drain region and no contact holes need to be provided. Instead, a space between the select gate structure 505 and the control gate structure 706, as well as a space between the control gate structure 706 and the transfer gate structure 506, may be filled with a silicide block layer 1014. Adjacent each of the gate structure 504 of the logic transistor 508, the select gate structure 505, the control gate structure 706 and the transfer gate structure 506, a respective sidewall spacer 205, 206, 207, 208 may be provided.

The gate structure 504 of the logic transistor 508 may include a gate insulation layer 1001 including a high-k dielectric material, a metal cap layer 1005 and a gate electrode formed from a workfunction adjustment metal layer 502 and a gate electrode metal layer 503. Similarly, the select gate structure 505 may include a select gate insulation layer 1002 including a high-k dielectric material and a metal cap layer 1006 and the transfer gate structure 506 may include a transfer gate insulation layer 1004 including a high-k dielectric material and a metal cap layer 1008. Additionally, each of the select gate structure 505 and the transfer gate structure 506 nat include a gate electrode formed from the workfunction adjustment metal layer 502 and the gate electrode metal layer 503.

The control gate structure 706 may include a charge trapping layer 701 including sublayers 702, 703, 704 and a layer 705 of control gate electrode material that provides a control gate electrode. Portions of the sidewall spacers 205 to 208, the silicide block layer 1014 and the interlayer dielectric 302 remaining in the semiconductor structure 1300 form an electrically insulating structure annularly enclosing the gate structures 504, 505, 506, 706.

The above-described features of the semiconductor structure 1300 may be formed by means of techniques as described above with reference to FIGS. 10-12, wherein additionally, a selective epitaxial growth process is performed for forming the raised source region 904, the raised drain region 905 and the raised source/drain regions 906, 907, wherein portions of a layer of sidewall spacer material may be used for covering the source/drain regions 214, 215, and an outdiffusion may be performed for forming the source region 209, the drain region 210, and the source/drain regions 213, 216 as described above with reference to FIG. 9. A hybrid replacement gate process may be performed for forming the gate structure 504 of the logic transistor, the select gate structure 505 and the transfer gate structure 506, wherein dummy gate electrodes are formed over the gate insulation layers 1001 to 1004 and the metal cap layers 1005 to 1008, and the dummy gate electrodes are later replaced by final gate electrodes formed from the workfunction adjustment metal layer 502 and gate electrode metal layer 503.

In further embodiments, which will be described in the following with reference to FIGS. 14a-16, gate structures of logic transistors and select gate structures and transfer gate structures of nonvolatile memory cells may be formed using gate first techniques, and replacement gate techniques may be employed only for the formation of control gate structures including charge trapping layers. For convenience, in FIGS. 1-13, on the one hand, and in FIGS. 14a-16, on the other hand, like reference numerals have been used to denote like components. Unless explicitly indicated otherwise, components denoted by like reference numerals may have corresponding features and corresponding methods may be used for the formation thereof.

Figure 14A:
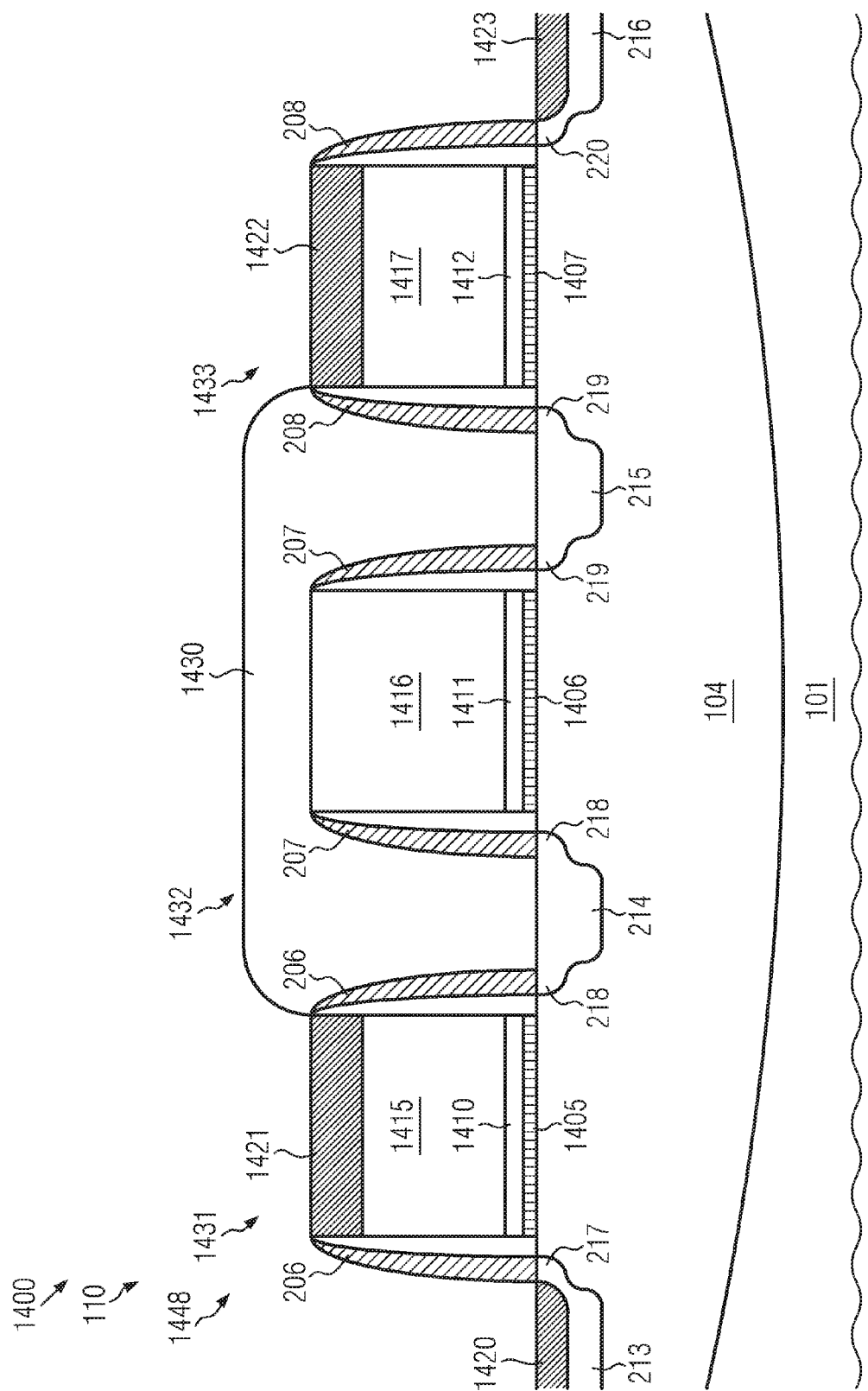
FIGS. 14A-16 show schematic cross-sectional views of a semiconductor structure according to an embodiment in stages of a method according to one illustrative embodiment disclosed herein.
Figure 14B:
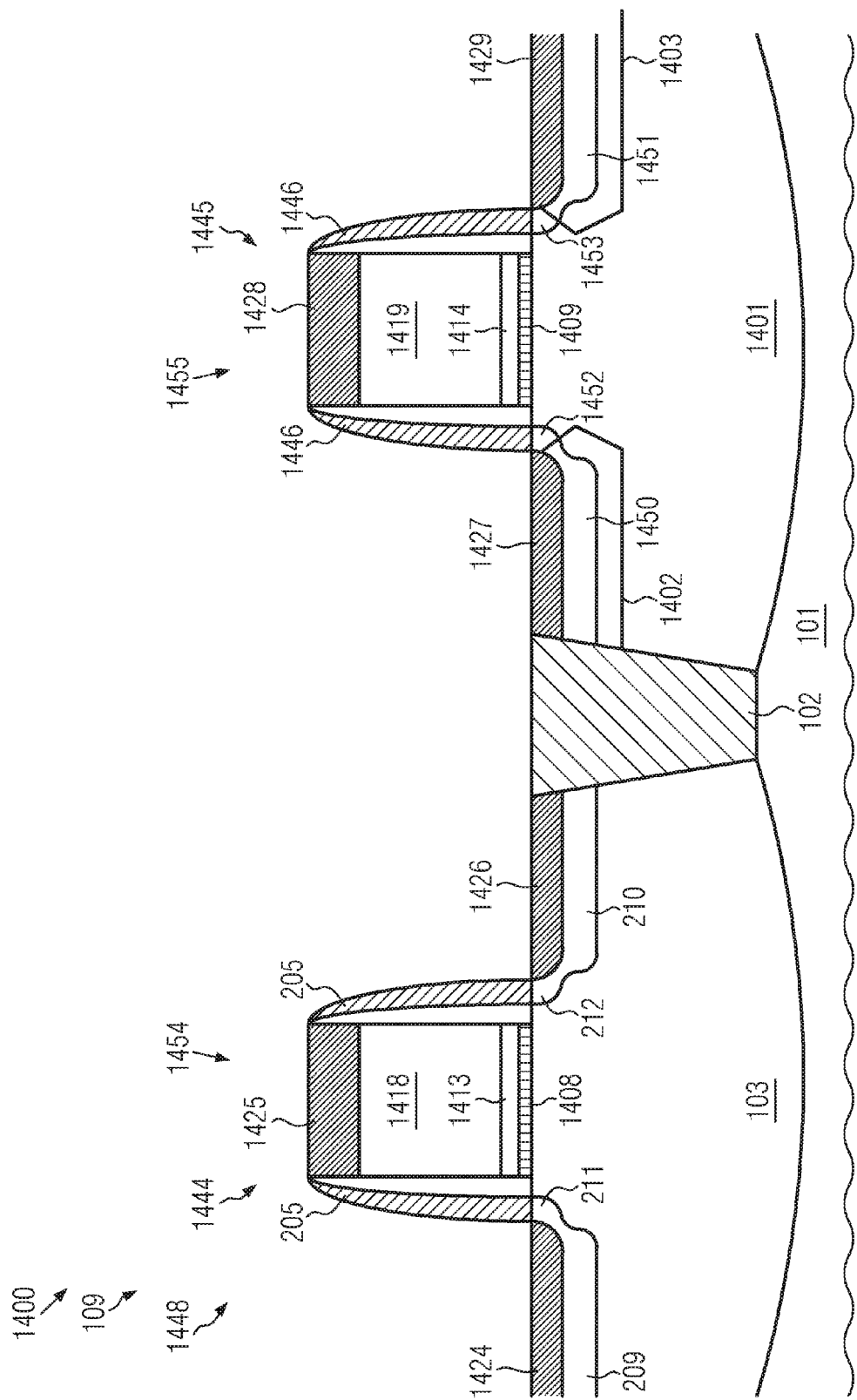

FIGS. 14a and 14b show schematic cross-sectional views of a semiconductor structure 1400 according to an embodiment in a stage of a method of manufacturing a semiconductor structure according to an embodiment. The semiconductor structure 1400 may include a nonvolatile memory cell region 110 (shown in FIG. 14a) and a logic transistor region 109 (shown in FIG. 14b).

In the logic transistor region 109, an N-channel field effect transistor 1454 and a P-channel field effect transistor 1455 may be provided. In the nonvolatile memory cell region 110, a nonvolatile memory cell element from which a nonvolatile memory cell will be formed may be provided.

In some embodiments, the semiconductor structure 1400 may include a bulk semiconductor substrate 101. In other embodiments, a fully depleted semiconductor-on-insulator substrate may be used, similar to the embodiments described above with reference to FIGS. 9 and 13.

The N-channel field effect transistor 1454 may include a logic transistor well 103, which may be P-doped. Additionally, the N-channel field effect transistor 1454 may include a source region 209, a drain region 210, a source extension 211 and a drain extension 212, which may be N-doped. The P-channel field effect transistor 1455 may include a logic transistor well 1401, which may be N-doped. Additionally, the P-channel field effect transistor 1455 may include a source region 1450, a drain region 1451, a source extension 1452 and a drain extension 1453, which may P-doped. At the source region 1450 and at the drain region 1451, silicon germanium regions 1402, 1403 may be provided. Alternatively, a contiguous silicon germanium region may be provided in the P-channel field effect transistor 1455, wherein silicon germanium is provided at each of the source region 1450, the drain region 1451, and a channel region of the P-channel field effect transistor between the source region 1450 and the drain region 1451 and/or different germanium contents may be provided in the channel region, on the one hand, and in the source region 1450 and the drain region 1451, on the other hand. A trench isolation structure 102 may provide electrical isolation between the well regions 103, 1401.

In the nonvolatile memory cell region 110, a nonvolatile memory cell well 104, which may be P-doped, may be provided in an active region of the nonvolatile memory cell element in the nonvolatile memory cell region 110. Additionally, the active region of the nonvolatile memory cell element may include source/drain regions 213, 214, 215, 216 and source/drain extensions 217, 218, 219, 220, which may be n-doped.

The N-channel field effect transistor 1454 may include a gate structure 1444 and the P-channel field effect transistor 1455 may include a gate structure 1445.

The gate structure 1444 of the N-channel field effect transistor 1454 may include a gate insulation layer 1408, a workfunction adjustment metal layer 1413 and a gate electrode 1418.

The gate insulation layer 1408 may include a high-k dielectric material. The workfunction adjustment metal layer 1413 may include a metal adapted for workfunction engineering in N-channel field effect transistors, such as titanium nitride. Over the workfunction adjustment metal layer 1413, which provides a part of a gate electrode of the N-channel field effect transistor 1454, a polysilicon gate electrode portion 1418 may be provided.

The gate structure 1445 of the P-channel field effect transistor 1455 may include a gate insulation layer 1409 including a high-k dielectric material, a workfunction adjustment metal layer 1414, and a polysilicon gate electrode portion 1419. The workfunction adjustment metal layer 1414 may be formed of a different material than the workfunction adjustment metal layer 1413 of the N-channel field effect transistor 1454. The workfunction adjustment metal layer 1414 may be adapted for workfunction engineering in P-channel transistors, and may include titanium nitride.

In the nonvolatile memory cell region 110, a select gate structure 1431 may be arranged between the source/drain regions 213, 214, a dummy control gate structure 1432 may be arranged between the source/drain regions 214, 215, and a transfer gate structure 1433 may be arranged between the source/drain regions 215, 216.

The select gate structure 1431 may include a gate insulation layer 1405, a workfunction adjustment metal layer 1410 and a polysilicon gate electrode portion 1415. The dummy control gate structure 1432 may include a dummy gate insulation layer 1406, a dummy workfunction adjustment metal layer 1411, and a polysilicon dummy gate electrode portion 1416. The transfer gate structure 1433 may include a gate insulation layer 1407, a workfunction adjustment metal layer 1412 and a polysilicon gate electrode portion 1417. The gate insulation layers 1405, 1407 and the dummy gate insulation layer 1406 may include a high-k dielectric material. The workfunction adjustment metal layers 1410, 1412 and the dummy workfunction adjustment metal layer 1411 may include a metal adapted for workfunction engineering in N-channel field effect transistors. In particular, they may be formed from substantially the same metal as the workfunction adjustment metal layer 1413 of the N-channel field effect transistor 1454.

Adjacent each of the gate structures 1444, 1445 of the logic transistors formed in the logic transistor region 109, the select gate structure 1431, the dummy control gate structure 1432 and the transfer gate structure 1433, sidewall spacers 205, 1446 and 206 to 208 may be provided, wherein each of the sidewall spacers 205, 1446 and 206 to 208 may include spacers formed of different materials.

In the formation of the above-described features of the semiconductor structure 1400, techniques similar to those conventionally employed in the formation of field effect structures by means of gate first techniques may be employed. In particular, after the formation of the trench isolation structure 102, ion implantation processes may be performed for forming the logic transistor well regions 103, 1401 and the nonvolatile memory cell well region 104, as described above with reference to FIG. 1. Thereafter, a gate stack 1448 may be formed over the substrate 101. The gate stack may include layers of materials of the gate structures 1444, 1445 of the logic transistors formed at the logic transistor region 109, and the select gate structure 1431, the dummy control gate structure 1432 and the transfer gate structure 1433 formed at the nonvolatile memory cell region 110.

For providing different materials for the formation of workfunction adjustment metal layers in gate structures of N-channel transistors and P-channel transistors, patterning techniques including photolithography and etching may be used. Furthermore, in some embodiments, layers of gate insulation material formed from different materials and/or having different thicknesses may be provided in the gate stack 1448. For example, a greater thickness of a layer of gate insulation material may be provided at the nonvolatile memory cell region 110 than at the logic transistor region 109, so that the nonvolatile memory cell can withstand relatively high voltage. This may be done by techniques of oxidation, deposition and/or patterning.

The gate stack may be patterned for forming the gate structures 1444, 1445, 1431, 1433 and the dummy control gate structure 1432. Thereafter, the sidewall spacers 205 to 208, 1446 may be formed by means of techniques of anisotropic deposition and etching, and the source regions 209, 1450, the drain regions 210, 1451, the source extensions 211, 1452, the drain extensions 212, 1453, the source/drain regions 213 to 216 and the source/drain extensions 217 to 220 may be formed by means of ion implantation. Additionally, the silicon germanium regions 1402, 1403 may be formed by etching portions of the semiconductor material of the substrate 101 adjacent the gate structure 1445 of the P-channel field effect transistor, and performing a selective epitaxial growth process for the deposition of silicon germanium. In embodiments wherein silicon germanium is provided also in the channel region of the P-channel transistor 1455 as described above, the formation of the silicon germanium may be performed before the formation of the gate structure 1445. Different ion implantation processes may be used for providing an N-type doping and a P-type doping, respectively. Furthermore, in some embodiments, different ion implantation processes may be performed for forming the source/drain regions 213, 216, on the one hand, and the source/drain regions 214, 215, on the other hand.

After the above-described steps of the method of manufacturing a semiconductor structure, a silicide block layer 1430 may be deposited over the semiconductor structure 1400 and patterned by techniques of photolithography and etching. The silicide block layer 1430 may include silicon nitride and techniques of chemical vapor deposition and plasma-enhanced chemical vapor deposition may be used for depositing the silicide block layer 1430.

The silicide block layer 1430 may cover the dummy control gate structure 1432, and it may fill the space between the select gate structure 1431 and the dummy control gate structure 1432 and the space between the dummy control gate structure 1432 and the transfer gate structure 1433. For this purpose, a sub-nominal pitch may be provided between the select gate structure 1431 and the dummy control gate structure 1432, and between the dummy control gate structure 1432, and the transfer gate structure 1433, similar to the embodiments described above with reference to FIGS. 10-13.

After the formation of the silicide block layer 1430, a silicidation process may be performed, wherein a layer of metal, such as nickel, is deposited over the semiconductor structure, one or more annealing processes are performed for inducing a chemical reaction between silicon and the metal and an etch process is performed for removing unreacted metal.

In the silicidation process, silicide 1420, 1421, 1422, 1423, 1424, 1425, 1426, 1427, 1428, 1429 may be formed in the source/drain regions 213, 216, the source regions 209, 1450, the drain regions 210, 1451, and the polysilicon portions 1415, 1417, 1418, 1419. The silicide block layer 1430 may substantially prevent the formation of silicide in the polysilicon dummy gate electrode portion 1416 of the dummy control gate structure 1432, and in the source/drain regions 214, 215.

Figure 15:
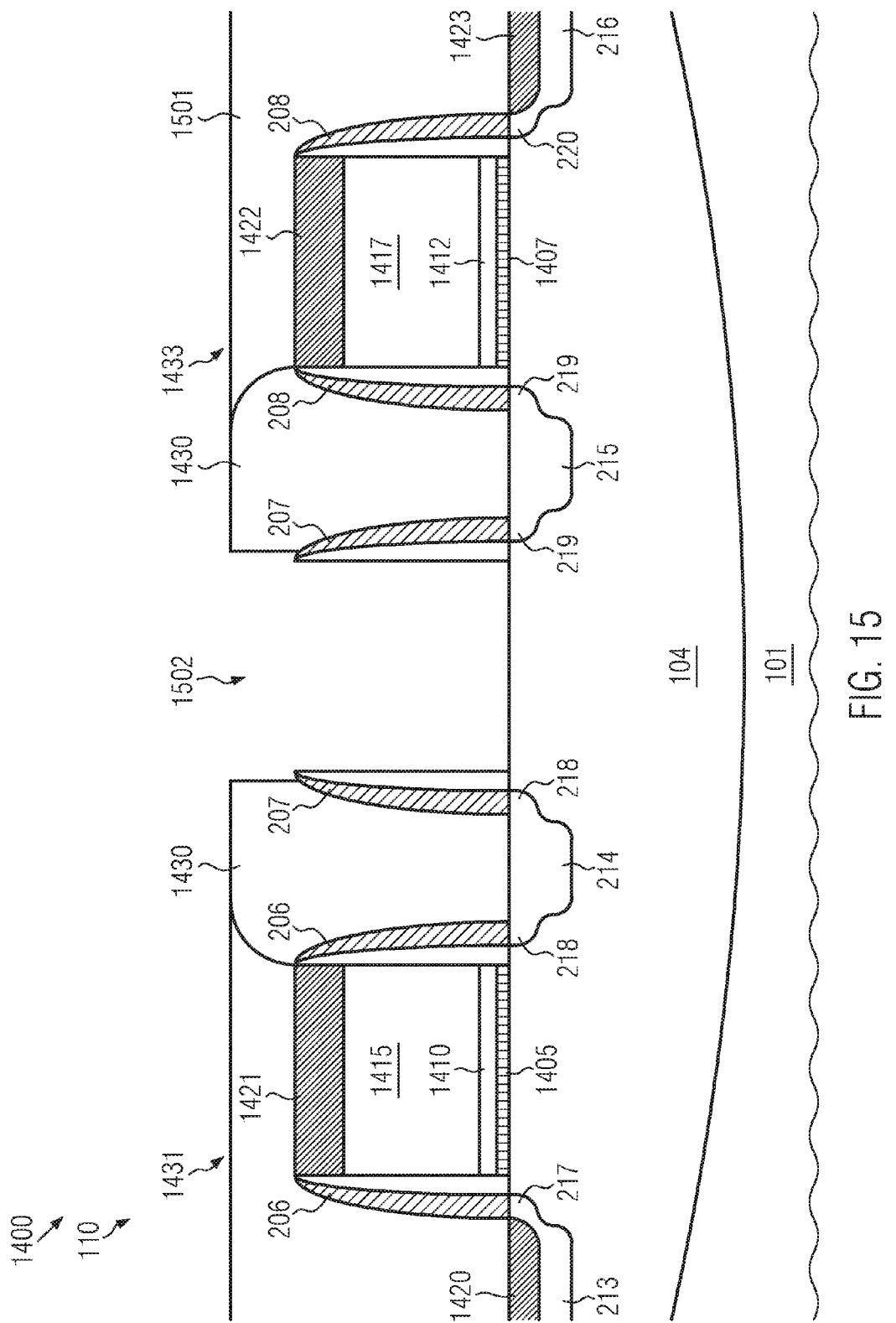

FIG. 15 shows a schematic cross-sectional view of the nonvolatile memory cell portion 110 of the semiconductor structure 1400 in a later stage of the manufacturing process. After the silicidation process, an interlayer dielectric 1501 may be deposited over the semiconductor structure 1400 and a chemical mechanical polishing process may be performed for planarizing the interlayer dielectric 1501. In some embodiments, the chemical mechanical polishing process may also expose the silicide block layer 1430.

Thereafter, a portion of the silicide block layer 1430 over the dummy control gate structure 1432 may be removed. This may be done by techniques of photolithography and etching. For etching the silicide block layer 1430, a dry etch process adapted for selectively removing silicon nitride relative to silicon dioxide may be used, so that the material of the silicide block layer 1430 is selectively removed relative to the material of the interlayer dielectric 1501. Thereafter, one or more etch processes adapted for removing the materials of the polysilicon dummy gate electrode portion 1416, the dummy workfunction adjustment metal layer 1411 and the dummy gate insulation layer 1406 may be performed. These etch processes may include processes of reactive ion etching, plasma etching and/or wet chemical etching, and they may remove the dummy control gate structure 1432, so that a recess 1502 is formed at the location of the dummy control gate structure 1432. At the bottom of the recess 1502, the semiconductor material of the substrate 101 in the active region of the nonvolatile memory cell element may be exposed.

Figure 16:
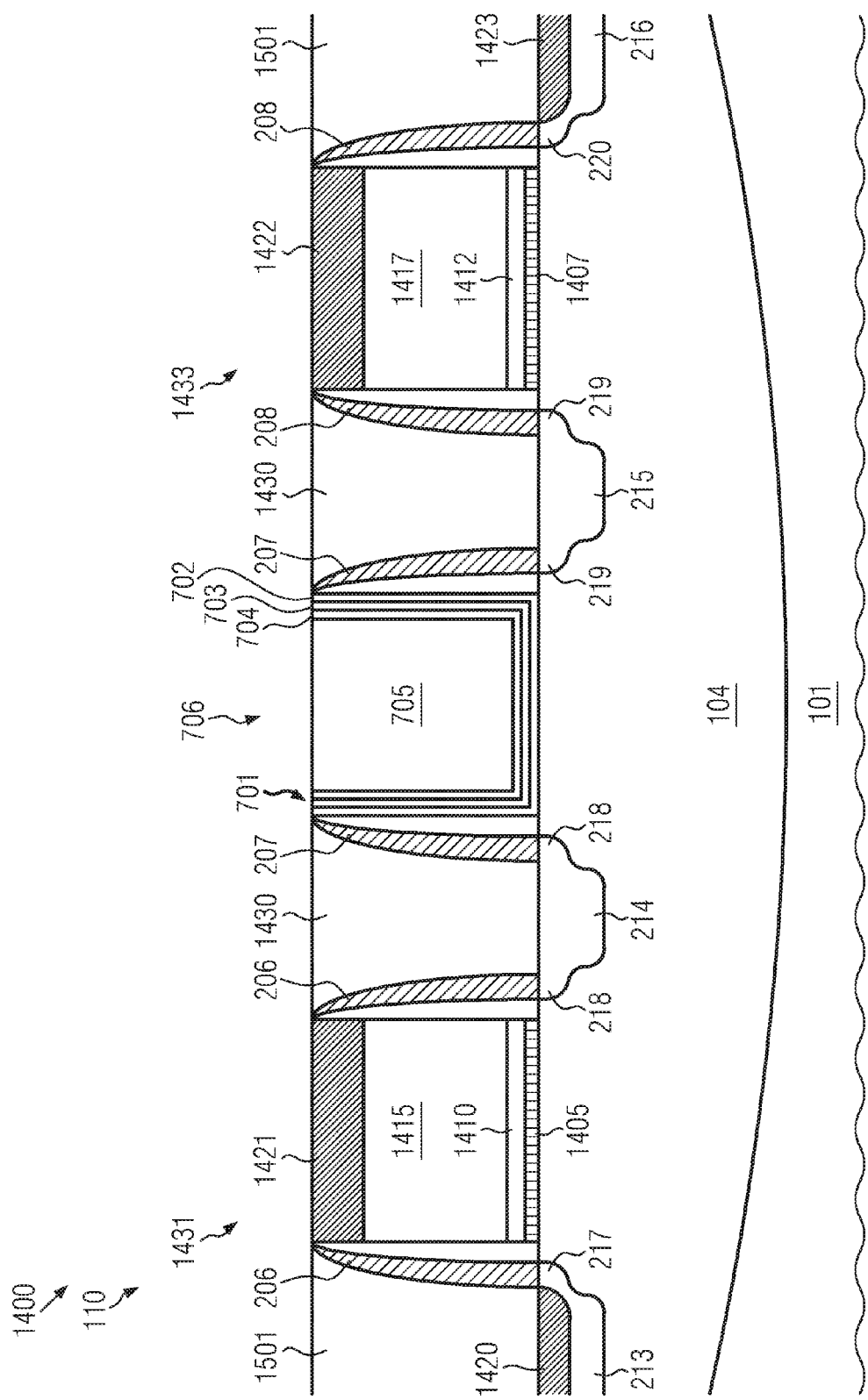

FIG. 16 shows a schematic cross-sectional view of the semiconductor structure 1400 in a later stage of the manufacturing process. After the removal of the dummy control gate structure 1432, a charge trapping layer 701 which may include sublayers 702, 703, 704 and a layer 705 of a control gate electrode material may be deposited over the semiconductor structure 1400. Then, a chemical mechanical polishing process may be performed for removing portions of the charge trapping layer 701 and the layer 705 of control gate electrode material outside the recess 1502 and for removing portions of the interlayer dielectric 1501 over the select gate structure 1431, the transfer gate structure 1433, and the gate structures 1444, 1445 of the logic transistors 1454, 1455 in the logic transistor region 109.

Thereafter, a further interlayer dielectric (not shown) may be deposited over the semiconductor structure 1400 and contact holes filled with an electrically conductive metal may be formed for providing electrical connections to the source regions 209, 1450, the drain regions 210, 1451, and the source/drain regions 213, 216.

After the process steps as described above with reference to FIGS. 1-16, middle-of-line and back-end-of-line processes may be performed for completing the formation of the semiconductor structure.

The source/drain regions 213 of nonvolatile memory cells as described herein may be electrically connected to bitlines of a nonvolatile memory and the source/drain regions 216 may be connected to source lines of the nonvolatile memory. The bitlines and source lines may extend along a bitline direction. The select gate electrodes, control gate electrodes and transfer gate electrodes may extend along a wordline direction that is perpendicular to the bitline direction and they may be contiguous with the select gate electrodes, control gate electrodes and transfer gate electrodes of adjacent memory cells. Depending on voltages applied to the select gate electrodes and the transfer gate electrodes, an electrical connection of the nonvolatile memory cell to the bitline and the source line may be established, and programming voltages, erase voltages and read voltages may be applied to the control gate electrodes for performing operations of programming, erasing and reading the nonvolatile memory cells. Depending on the embodiment, those skilled in the art are aware of the needed programming, erase and read voltages which need to be applied.

The present disclosure is not limited to embodiments wherein a high-k metal gate structure is provided in gate structures 1444, 1445 of the logic transistors 1454, 1455, the select gate structure 1431 and the transfer gate structure 1433. Alternatively, a silicon oxynitride polysilicon gate structure including a gate insulation layer including insulating silicon oxynitride and a gate electrode including polysilicon may be provided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    providing a semiconductor structure comprising a nonvolatile memory cell element comprising an active region formed in a semiconductor material, a select gate structure, a dummy control gate structure and a transfer gate structure, and an electrically insulating structure extending around each of said select gate structure, said dummy control gate structure and said transfer gate structure;
    removing said dummy control gate structure, wherein a first recess is formed in said semiconductor structure;
    after removing said dummy control gate structure, depositing a charge trapping layer and a layer of a control gate electrode material over said semiconductor structure; and
    removing portions of said charge trapping layer and said layer of said control gate electrode material over said electrically insulating structure, portions of said charge trapping layer and said layer of said control gate electrode material in said first recess providing a control gate structure of said nonvolatile memory cell.

2. The method of claim 1, wherein said dummy control gate structure is arranged between said select gate structure and said transfer gate structure, said semiconductor structure further comprising:
    a first source/drain region at a side of said select gate structure opposite said dummy control gate structure, a second source/drain region between said select gate structure and said dummy control gate structure, a third source/drain region between said dummy control gate structure and said transfer gate structure and a fourth source/drain region at a side of said transfer gate structure opposite said dummy control gate structure;
    wherein the method further comprises forming a silicide at said first source/drain region and said fourth source/drain region, wherein no silicide is formed at said second source/drain region and said third source/drain region.

3. The method of claim 2, wherein said semiconductor structure further comprises a logic transistor.

4. The method of claim 3, wherein said charge trapping layer comprises at least one of an oxide-nitride-oxide layer, an alumina-nitride-oxide layer, a silicon-rich silicon dioxide layer and a layer of nanocrystalline silicon.

5. The method of claim 4, wherein said layer of control gate electrode material comprises at least one of aluminum, tungsten and polysilicon.

6. The method of claim 5, wherein one of the following is fulfilled:
    each of said select gate structure and said transfer gate structure comprises a gate insulation layer comprising a high-k dielectric material having a greater dielectric constant than silicon dioxide and a gate electrode comprising one or more metals; or
    each of said select gate structure and said transfer gate structure comprises a gate insulation layer comprising silicon oxynitride and a gate electrode comprising polysilicon.

7. The method of claim 6, wherein said providing of said semiconductor structure comprises:
    depositing a dummy gate stack over said semiconductor material;
    patterning said dummy gate stack, wherein a dummy select gate structure, said dummy control gate structure and a dummy transfer gate structure are formed over said semiconductor material;
    forming said electrically insulating structure, said electrically insulating structure annularly enclosing each of said dummy select gate structure, said dummy control gate structure and said dummy transfer gate structure;
    performing a first etch process removing said dummy select gate structure and said dummy transfer gate structure, wherein a second recess is formed in said semiconductor structure at a location of said dummy select gate structure and a third recess is formed in said semiconductor structure at a location of said dummy transfer gate structure, said dummy control gate structure remaining in said semiconductor structure;

depositing a gate insulation material layer and a gate electrode material layer over said semiconductor structure; and removing portions of said gate insulation material layer and said gate electrode material layer over said electrically insulating structure, portions of said gate insulation material layer and said gate electrode material layer in said second recess forming said select gate structure, and portions of said gate insulation material layer and said gate electrode material layer in said third recess forming said transfer gate structure.

8. The method of claim 7, further comprising:

wherein, in said patterning of said dummy gate stack, a dummy gate structure of said logic transistor is formed, said electrically insulating structure annularly enclosing said dummy gate structure of said logic transistor; and wherein said first etch process removes said dummy gate structure of said logic transistor, wherein a fourth recess is formed in said semiconductor structure at the location of said dummy gate structure of said logic transistor, portions of said gate insulation layer and said gate electrode material layer deposited in said fourth recess forming a gate structure of said logic transistor.

9. The method of claim 8, further comprising, after said removal of said portions of said charge trapping layer and said layer of control gate electrode material over said electrically insulating structure, performing the following:

forming an interlayer dielectric over said semiconductor structure;

forming a first contact hole over said first source/drain region extending through said interlayer dielectric and said electrically insulating structure;

forming a second contact hole over said fourth source/drain region, said second contact hole extending through said interlayer dielectric and said electrically insulating structure;

wherein no contact holes are formed over said second source/drain region and said third source/drain region;

forming a silicide at a bottom of said first contact hole and said second contact hole; and filling said first and said second contact holes with an electrically conductive material, said first contact hole filled with said electrically conductive material providing an electrical connection to said first source/drain region, said second contact hole filled with said electrically conductive material providing an electrical connection to said fourth source/drain region.

10. The method of claim 9, wherein said semiconductor material comprises a bulk semiconductor wafer.

11. The method of claim 9, wherein said semiconductor material comprises a semiconductor layer of a fully depleted semiconductor-on-insulator structure, and wherein said providing of said semiconductor structure further comprises:

performing an epitaxial growth process forming a first raised source/drain region over said first source/drain region and a second raised source/drain region over said fourth source/drain region, wherein no raised source/drain regions are formed over said second source/drain region and said third source/drain region.

12. The method of claim 6, wherein said select gate structure comprises a select gate insulation layer and a select gate electrode over said select gate insulation layer and said transfer gate structure comprises a transfer gate insulation layer and a transfer gate electrode over said transfer gate insulation layer, and wherein said providing of said semiconductor structure comprises:

depositing a layer stack comprising a gate insulation material layer and a dummy gate electrode material layer over said semiconductor material;

patterning said layer stack, wherein said select gate insulation layer, a dummy select gate electrode over said select gate insulation layer, said dummy control gate structure, said transfer gate insulation layer and a dummy transfer gate electrode over said dummy transfer gate insulation layer are formed;

forming said electrically insulating structure, said electrically insulating structure annularly enclosing each of said dummy select gate electrode, said dummy control gate structure and said dummy transfer gate electrode;

performing a first etch process removing said dummy select gate electrode and said dummy transfer gate electrode, wherein a second recess is formed in said semiconductor structure at the location of said dummy select gate electrode and a third recess is formed in said semiconductor structure at the location of said dummy transfer gate electrode, said dummy control gate structure, said select gate insulation layer and said transfer gate insulation layer remaining in said semiconductor structure;

depositing a gate electrode material layer over said semiconductor structure; and removing portions of said gate electrode material layer over said electrically insulating structure, said select gate insulation layer and portions of said gate electrode material layer in said second recess forming said select gate structure, said transfer gate insulation layer and portions of said gate electrode material layer in said third recess forming said transfer gate structure.

13. The method of claim 12, further comprising:

forming said first source/drain region, said second source/drain region, said third source/drain region and said fourth source/drain region;

depositing a silicide block layer over said semiconductor structure, wherein said silicide block layer fills a space between said dummy select gate electrode and said dummy control gate structure and a space between said dummy control gate structure and said dummy transfer gate electrode;

patterning said silicide block layer, wherein portions of said silicide block layer over said first source/drain region and said fourth source/drain region are removed, a portion of said silicide block layer in said space between said dummy select gate electrode and said dummy control gate structure and a portion of said silicide block layer in said space between said dummy control gate structure and said dummy transfer gate electrode remaining in said semiconductor structure; and after said patterning of said silicide block layer, performing a silicidation process, wherein said silicide at said first source/drain region and said silicide at said fourth source/drain region are formed.

14. The method of claim 13, further comprising, after said silicidation process, depositing an interlayer dielectric over said semiconductor structure and performing a polishing process wherein portions of said silicide block layer and said first interlayer dielectric over said dummy select gate electrode, said dummy control gate structure and said dummy transfer gate electrode are removed, said electrically insulating structure comprising portions of said silicide block layer and said first interlayer dielectric that are not removed in said polishing process.

15. The method claim 14, wherein, in said patterning of said layer stack, a gate insulation layer of said logic transistor and a dummy gate electrode of said logic transistor are formed;
 wherein said first etch process removes said dummy gate electrode of said logic transistor, wherein a fourth recess is formed in said semiconductor structure at the location of said dummy gate electrode of said logic transistor, said gate insulation layer of said logic transistor remaining in said semiconductor structure, portions of said gate electrode material layer deposited in said fourth recess forming a gate electrode of said logic transistor.

16. The method of claim 15, wherein said semiconductor material comprises a bulk semiconductor wafer.

17. The method of claim 15, wherein said semiconductor material comprises a semiconductor layer of a fully depleted semiconductor-on-insulator structure, and wherein said providing of said semiconductor structure further comprises:
 performing an epitaxial growth process forming a first raised source/drain region over said first source/drain region and a second raised source/drain region over said fourth source/drain region, wherein no raised source/drain regions are formed over said second source/drain region and said third source/drain region.

18. The method of claim 6, wherein said providing of said semiconductor structure comprises:
 depositing a gate stack over said semiconductor material; and
 patterning said gate stack, wherein said select gate structure, said dummy control gate structure and said transfer gate structure are formed; and
 after said patterning of said gate stack, forming said electrically insulating structure.

19. The method of claim 18, further comprising:
 performing one or more ion implantation processes, wherein said first source/drain region, said second source/drain region, said third source/drain region and said fourth source/drain region are formed;
 depositing a silicide block layer over said semiconductor structure, wherein said silicide block layer fills a space between said select gate structure and said dummy control gate structure and a space between said dummy control gate structure and said transfer gate structure, and wherein said silicide block layer covers said dummy control gate structure;
 patterning said silicide block layer, wherein portions of said silicide block layer over said first source/drain region and said fourth source/drain region are removed, and a portion of said silicide block layer in said space between said select gate structure and said control gate structure, a portion of said silicide block layer in said space between said control gate structure and said transfer gate structure and a portion of said silicide block layer over said dummy control gate structure remain in said semiconductor structure; and
 after said patterning of said silicide block layer, performing a silicidation process wherein said silicide at said first source/drain region and said silicide at said fourth source/drain region are formed.

20. The method of claim 19, further comprising:
 after said silicidation process, depositing an interlayer dielectric over said semiconductor structure and performing a polishing process wherein portions of said silicide block layer over said control gate structure are exposed, said electrically insulating structure comprising portions of said silicide block layer and said first interlayer dielectric that are not removed in said polishing process;
 wherein said removal of said dummy control gate structure comprises performing one or more etch processes that remove at least a part of said portion of said silicide block layer over said control gate structure and said control gate structure.

21. The method of claim 20, wherein said logic transistor comprises an active region comprising silicon germanium.

22. The method of claim 6, wherein said providing of said semiconductor structure comprises:
 performing one or more first ion implantation processes wherein ions of a first dopant are implanted into a well region of said logic transistor; and
 performing one or more second ion implantation processes wherein ions of said first dopant are implanted into a well region of said nonvolatile memory cell.

23. The method of claim 22, wherein said providing of said semiconductor structure comprises:
 performing one or more third ion implantation processes wherein ions of a second dopant are implanted into a source region of said logic transistor and a drain region of said logic transistor; and
 performing one or more fourth ion implantation processes wherein ions of said second dopant are implanted into one or more of said first source/drain region, said second source/drain region, said third source/drain region and said fourth source/drain region.

24. A semiconductor structure, comprising:
 a logic transistor, said logic transistor comprising a gate structure; and
 a nonvolatile memory cell, said nonvolatile memory cell comprising:
  an active region comprising a first source/drain region, a second source/drain region, a third source/drain region and a fourth source/drain region;
  a select gate structure positioned between said first source/drain region and said second source/drain region;
  a control gate structure positioned between said second source/drain region and said third source/drain region, said control gate structure comprising a charge trapping layer and a control gate electrode over said charge trapping layer, wherein said charge trapping layer comprises at least one of an oxide-nitride-oxide layer, an alumina-nitride-oxide layer, a silicon-rich silicon dioxide layer and a layer of nanocrystalline silicon, and wherein said control gate electrode comprises at least one of polysilicon, aluminum and tungsten; and
  a transfer gate structure between said third source/drain region and said fourth source/drain region;
 wherein said first source/drain region and said fourth source/drain region comprise a silicide;
 wherein no silicide is provided in said second source/drain region and said third source/drain region;
 wherein each of said select gate structure, said transfer gate structure, and said gate structure of said logic transistor comprises one of a silicon oxynitride/polysilicon gate structure and a high-k metal gate structure;
 wherein said silicon oxynitride/polysilicon gate structure comprises a gate insulation layer comprising silicon oxynitride and a gate electrode comprising polysilicon; and
 wherein said high-k metal gate structure comprises a gate insulation layer comprising a high-k material having a greater dielectric constant than silicon dioxide and a gate electrode comprising one or more metals.

\* \* \* \* \*